United States Patent
Eguchi et al.

(10) Patent No.: US 8,043,936 B2
(45) Date of Patent: Oct. 25, 2011

(54) METHOD FOR MANUFACTURING SEMICONDUCTOR DEVICE

(75) Inventors: Shingo Eguchi, Tochigi (JP); Yohei Monma, Tochigi (JP); Atsuhiro Tani, Utsunomiya (JP); Misako Hirosue, Naka (JP); Kenichi Hashimoto, Shimotsuga (JP); Yasuharu Hosaka, Shimotsuga (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/232,049

(22) Filed: Sep. 10, 2008

(65) Prior Publication Data
US 2009/0017599 A1    Jan. 15, 2009

Related U.S. Application Data

(63) Continuation of application No. 11/902,515, filed on Sep. 21, 2007.

(30) Foreign Application Priority Data

Sep. 29, 2006    (JP) .................................. 2006-266543

(51) Int. Cl.
*H01L 21/30*    (2006.01)
*H01L 21/46*    (2006.01)
*H01L 21/322*    (2006.01)
*H01L 21/20*    (2006.01)
*H01L 21/36*    (2006.01)
*H01G 9/20*    (2006.01)

(52) U.S. Cl. ........ 438/458; 438/455; 438/477; 438/497; 257/E21.237; 257/E21.57

(58) Field of Classification Search ........................ None
See application file for complete search history.

(56) References Cited

U.S. PATENT DOCUMENTS 5,821,138 A    10/1998    Yamazaki et al.
(Continued)

FOREIGN PATENT DOCUMENTS

CN    1283874    2/2001
(Continued)

OTHER PUBLICATIONS

Office Action (Application No. 2008-0102326) dated May 25, 2009.
(Continued)

*Primary Examiner* — Ha Tran T Nguyen
*Assistant Examiner* — Valerie Brown
(74) *Attorney, Agent, or Firm* — Eric J. Robinson; Robinson Intellectual Property Law Office, P.C.

(57) ABSTRACT

An object is to suppress discharge due to static electricity generated by peeling, when an element formation layer including a semiconductor element is peeled from a substrate. Over the substrate, the release layer and the element formation layer are formed. The support base material which can be peeled later is fixed to the upper surface of the element formation layer. The element formation layer is transformed through the support base material, and peeling is generated at an interface between the element formation layer and the release layer. Peeling is performed while the liquid is being supplied so that the element formation layer and the release layer which appear sequentially by peeling are wetted with the liquid such as pure water. Electric charge generated on the surfaces of the element formation layer and the release layer can be diffused by the liquid, and discharge by peeling electrification can be eliminated.

31 Claims, 15 Drawing Sheets

U.S. PATENT DOCUMENTS

| | | | |
|---|---|---|---|
| 5,854,123 | A | 12/1998 | Sato et al. |
| 5,891,298 | A | 4/1999 | Kuroda et al. |
| 6,072,239 | A | 6/2000 | Yoneda et al. |
| 6,100,166 | A | 8/2000 | Sakaguchi et al. |
| 6,127,199 | A | 10/2000 | Inoue et al. |
| 6,326,279 | B1 | 12/2001 | Kakizaki et al. |
| 6,372,608 | B1 | 4/2002 | Shimoda et al. |
| 6,391,220 | B1 | 5/2002 | Zhang et al. |
| 6,452,091 | B1 * | 9/2002 | Nakagawa et al. ............ 136/261 |
| 6,544,430 | B2 | 4/2003 | McCormack et al. |
| 6,592,739 | B1 | 7/2003 | Sonoda et al. |
| 6,645,830 | B2 | 11/2003 | Shimoda et al. |
| 6,682,963 | B2 | 1/2004 | Ishikawa |
| 6,818,530 | B2 | 11/2004 | Shimoda et al. |
| 6,849,877 | B2 | 2/2005 | Yamazaki et al. |
| 6,953,735 | B2 | 10/2005 | Yamazaki et al. |
| 6,982,181 | B2 | 1/2006 | Hideo |
| 7,015,075 | B2 | 3/2006 | Fay et al. |
| 7,029,950 | B2 | 4/2006 | Yonehara et al. |
| 7,060,153 | B2 | 6/2006 | Yamazaki et al. |
| 7,060,591 | B2 | 6/2006 | Yamazaki et al. |
| 7,067,392 | B2 | 6/2006 | Yamazaki et al. |
| 7,094,665 | B2 | 8/2006 | Shimoda et al. |
| 7,147,740 | B2 | 12/2006 | Takayama et al. |
| 7,241,666 | B2 | 7/2007 | Goto et al. |
| 7,271,076 | B2 | 9/2007 | Yamazaki et al. |
| 7,285,476 | B2 | 10/2007 | Shimoda et al. |
| 7,332,381 | B2 | 2/2008 | Maruyama et al. |
| 7,351,300 | B2 | 4/2008 | Takayama et al. |
| 7,446,339 | B2 | 11/2008 | Yamazaki et al. |
| 7,465,674 | B2 | 12/2008 | Tamura et al. |
| 7,536,780 | B2 | 5/2009 | Shimizu et al. |
| 7,540,079 | B2 | 6/2009 | Okuyama et al. |
| 7,566,633 | B2 | 7/2009 | Koyama et al. |
| 7,591,863 | B2 | 9/2009 | Watanabe et al. |
| 7,601,236 | B2 | 10/2009 | Yamashita et al. |
| 7,648,862 | B2 | 1/2010 | Maruyama et al. |
| 7,704,765 | B2 | 4/2010 | Maruyama et al. |
| 2003/0032210 | A1 | 2/2003 | Takayama et al. |
| 2004/0209442 | A1 * | 10/2004 | Takakuwa et al. ............ 438/458 |
| 2005/0176180 | A1 | 8/2005 | Fay et al. |
| 2005/0229370 | A1 | 10/2005 | Kobayashi |
| 2005/0266591 | A1 | 12/2005 | Hideo |
| 2006/0011288 | A1 | 1/2006 | Watanabe et al. |
| 2006/0121694 | A1 | 6/2006 | Tamura |
| 2006/0131069 | A1 | 6/2006 | Shimizu et al. |
| 2006/0199382 | A1 | 9/2006 | Sugiyama et al. |
| 2006/0216909 | A1 | 9/2006 | Yamazaki et al. |
| 2007/0010067 | A1 | 1/2007 | Shimoda et al. |
| 2007/0078228 | A1 * | 4/2007 | Tateishi et al. ................ 525/242 |
| 2007/0166954 | A1 | 7/2007 | Yamazaki et al. |
| 2007/0176234 | A1 | 8/2007 | Yamazaki et al. |
| 2007/0181246 | A1 | 8/2007 | Yamashita et al. |
| 2007/0196999 | A1 | 8/2007 | Tamura et al. |
| 2007/0243352 | A1 | 10/2007 | Takayama et al. |
| 2008/0011420 | A1 | 1/2008 | Yoshizawa et al. |
| 2008/0042168 | A1 | 2/2008 | Watanabe et al. |
| 2008/0044940 | A1 | 2/2008 | Watanabe et al. |
| 2008/0113486 | A1 | 5/2008 | Eguchi et al. |
| 2008/0259575 | A1 | 10/2008 | Tanimura et al. |
| 2009/0017567 | A1 | 1/2009 | Eguchi et al. |
| 2009/0023251 | A1 | 1/2009 | Eguchi et al. |
| 2009/0042387 | A1 | 2/2009 | Yamada et al. |
| 2009/0194771 | A1 | 8/2009 | Koyama et al. |
| 2010/0096090 | A1 | 4/2010 | Yoshioka et al. |
| 2010/0148179 | A1 | 6/2010 | Maruyama et al. |

FOREIGN PATENT DOCUMENTS

| | | |
|---|---|---|
| CN | 1458665 | 11/2003 |
| CN | 1618602 | 5/2005 |
| CN | 1832179 | 9/2006 |
| EP | 0 848 415 | 6/1998 |
| EP | 1 069 602 | 1/2001 |
| EP | 1 363 319 | 11/2003 |
| JP | 09-100448 A | 4/1997 |
| JP | 10-125931 | 5/1998 |
| JP | 2000-279852 A | 10/2000 |
| JP | 2001-026500 | 1/2001 |
| JP | 2001-111081 | 4/2001 |
| JP | 2001-328849 | 11/2001 |
| JP | 2001-331120 | 11/2001 |
| JP | 2003-174153 | 6/2003 |
| JP | 2003-237263 A | 8/2003 |
| JP | 2004-047975 | 2/2004 |
| JP | 2004-153021 A | 5/2004 |
| JP | 2004-158765 A | 6/2004 |
| JP | 2004-311955 | 11/2004 |
| JP | 2005-079395 | 3/2005 |
| JP | 2005-079553 | 3/2005 |
| JP | 2005-148638 | 6/2005 |
| JP | 2006-202820 | 8/2006 |
| JP | 2006-216891 A | 8/2006 |
| JP | 2006-259095 A | 9/2006 |
| JP | 2007-184495 A | 7/2007 |
| KR | 1999-028523 | 4/1999 |
| KR | 2005-048517 | 5/2005 |
| WO | WO 97/08745 | 3/1997 |
| WO | 2006/003816 | 1/2006 |

OTHER PUBLICATIONS

Office Action (Application No. 2008-0102327) dated May 25, 2009.
Office Action (Application No. 2008-0102328) dated May 25, 2009.
Office Action (Application No. 200810168156.5) dated Aug. 28, 2009.
Office Action (Application No. 200810168157.X) dated Aug. 21, 2009.
Office Action (Application Serial No. 200810168158.4) dated Oct. 9, 2009.
Office Action (Application Serial No. 200710153243.9) dated Apr. 1, 2010.
Office Action (U.S. Appl. No. 12/232,036) dated Nov. 12, 2009.
Office Action (U.S. Appl. No. 12/232,036) dated Feb. 24, 2010.
Office Action (U.S. Appl. No. 12/232,036) dated Jul. 9, 2010.
Office Action (U.S. Appl. No. 12/232,037) dated Oct. 16, 2009.
Office Action (U.S. Appl. No. 12/232,037) dated Feb. 25, 2010.
Office Action (U.S. Appl. No. 12/232,037) dated Jul. 13, 2010.
Official Action (U.S. Appl. No. 12/232,036) dated Sep. 14, 2010.
Official Action (U.S. Appl. No. 11/902,515) dated Sep. 13, 2010.
Official Action (U.S. Appl. No. 12/232,037) dated Sep. 15, 2010.
Office Action (U.S. Appl. No. 12/232,036) dated Mar. 21, 2011.
Office Action (U.S. Appl. No. 12/232,037) dated Mar. 21, 2011.
Notice of Allowance (U.S. Appl. No. 11/902,515) dated Apr. 4, 2011.
Notice of Allowance (U.S. Appl. No. 11/902,515) dated Jun. 23, 2011.
Notice of Allowance (U.S. Appl. No. 12/232,036) dated May 23, 2011.
Notice of Allowance (U.S. Appl. No. 12/232,036) dated Jul. 6, 2011.

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device, and relates to a technique for separating an element formation layer including a semiconductor element from a substrate which is used at the time of manufacture.

In the present invention, a semiconductor device to be an object of manufacture includes a semiconductor element which can function by using semiconductor characteristics and general devices which function by using a plurality of semiconductor elements.

As the semiconductor element, a MOS transistor, a transistor such as a thin film transistor, a diode, a MOS capacitor, and the like are given as examples. In addition, the semiconductor device includes an integrated circuit having a plurality of semiconductor elements, a device having a plurality of integrated circuits, or a device having an integrated circuit and another element. The integrated circuit includes a memory circuit such as a CPU, a ROM, or a RAM, for example.

The device having a plurality of integrated circuits and the device having an integrated circuit and another element include, for example, a liquid crystal module substrate, a liquid crystal module using this module substrate, a liquid crystal display device using this module substrate, an EL (electroluminescence) module substrate, an EL module using this module substrate, an EL display device using this module substrate, an electronic device in which the liquid crystal module or the EL module is used as display means, an IC chip which is provided with an antenna and capable of wireless communication, an electronic tag provided with such an IC chip, an IC card, and the like.

2. Description of the Related Art

A technique has been developed, in which after an integrated circuit is formed of a semiconductor element such as a thin film transistor (TFT) over a base material such as a glass substrate or a quartz substrate, the base material used in manufacturing the integrated circuit is transferred to a plastic film base material. A step of separating the integrated circuit from a substrate used in manufacture is necessary to transfer the integrated circuit to another base material. Therefore, a technique has been developed, in which the integrated circuit is peeled from the substrate.

For example, the following peeling technique using laser ablation is described in Reference 1 (Japanese Published Patent Application No. H10-125931). A separation layer formed of amorphous silicon or the like is provided over a substrate, a layer to be peeled which is formed of a thin film element is provided over the separation layer, and the layer to be peeled is attached to a transfer body with an adhesive layer. The separation layer is ablated by laser beam irradiation, so that peeling is generated in the separation layer.

In addition, a technique in which peeling is performed with physical force such as human hands is described in Reference 2 (Japanese Published Patent Application No. 2003-174153). In Reference 2, a metal layer is formed between a substrate and an oxide layer, and a layer to be peeled and the substrate are separated from each other by using weak bonding at an interface between the oxide layer and the metal layer and generating peeling at the interface between the oxide layer and the metal layer.

It is known that, when peeling is generated, electric charge is generated on surfaces of two separated layers to be easily charged. This phenomenon is called peeling electrification. Since surfaces of two layers are close to each other at the moment when peeling is generated, capacitance is generated between these surfaces. When peeling proceeds, the capacitance is reduced with increase in a distance between two layers. However, the amount of electric charge generated by peeling electrification is not changed; therefore, a potential of the surface of the layer increases in inverse proportion to the capacitance. When the potential of the surface of the peeled layer increases, electric charge which is charged on the surface of the layer discharges toward inside of the layer in some cases.

Accordingly, when an object to be peeled is an integrated circuit, a semiconductor film, an insulating film, a conductive film, or the like is destroyed by being melted due to heat generated by discharge. As a result of this, a semiconductor element does not function in some cases. Even when the semiconductor element can operate without receiving damage which can be seen by appearance, a semiconductor or an insulator deteriorates due to high potential application and the semiconductor element does not show expected characteristics in some cases. Therefore, when discharge due to static electricity is generated, there is a possibility that the semiconductor element can be destroyed, or the integrated circuit itself using the semiconductor element cannot be operated normally due to characteristic deterioration.

Destruction of a semiconductor element or the like due to electrostatic discharge (hereinafter referred to as "ESD") is called an electrostatic breakdown. The electrostatic breakdown is one of causes which greatly reduce yield. As a conventional method for avoiding the electrostatic breakdown, there are a method in which discharge due to static electricity is not generated and a method in which damage caused by discharge to the semiconductor element is suppressed even when discharge is generated due to static electricity. As the former method, a method for eliminating generated static electricity by providing an ionizer in semiconductor manufacturing equipment is known. A typical example of the latter method is a method for manufacturing a protection circuit with a semiconductor element, and a high potential generated by discharge can be prevented from being applied to the semiconductor element because of the protection circuit.

Even when static electricity is generated, the electrostatic breakdown is not generated as long as discharge does not occur. Discharge is easy to be generated when a potential difference between two objects is large. Accordingly, the ionizer is a device for supplying a positive ion and a negative ion to the air which serves as a path of discharge and for not generating a large potential difference which brings discharge between the objects. However, since discharge due to peeling electrification is an instantaneous event in which two layers are separated, elimination of electric charge by the ionizer is not in time in some cases.

In addition, in the case of providing a protection circuit, when electric charge of discharge passes through the protection circuit, the protection circuit functions; therefore, destruction of a semiconductor element can be avoided. However, in peeling electrification, since the surfaces of two layers to be separated are charged, the pass of discharge does not always pass through the protection circuit. Accordingly, in peeling electrification, the electrostatic breakdown is not sufficiently prevented by the protection circuit.

For example, a method for preventing discharge due to peeling electrification is described in Reference 3 (Japanese Published Patent Application No. 2005-79395, referred to Scope of Claims, Lines 42 to 48 in Page 9). A conductive film is formed over a substrate, and a stack including a semiconductor element or the like is formed thereover. By generating peeling at an interface between the substrate and the conductive film and diffusing electric charge generated in peeling in the conductive film, destruction and characteristic deterioration of the semiconductor element due to electric charge is avoided.

However, by a peeling method of Reference 3, the conductive film remains in a lower portion of the stack. Depending on an intended purpose of the stack, the conductive film becomes an obstacle and an expected intended purpose cannot be carried out because of the conductive film in some cases. In such a case, it is necessary to remove the conductive film in the peeling method described in Reference 3.

SUMMARY OF THE INVENTION

One object of the present invention is to avoid destruction and characteristic deterioration of a semiconductor element due to electric charge generated by peeling. In addition, in Reference 3, although a lower surface of a semiconductor element after peeling is limited to a conductive film, another object of the present invention is to permit us to select a high-resistant insulating material for a surface of the semiconductor element side after peeling.

In order to solve the foregoing problems, the present invention includes means for not permitting to discharge electric charge charged by peeling either inside of two separated layers. More specifically, one feature of a method for manufacturing a semiconductor device of the present invention is that a surface which appears by separating an element formation layer including a semiconductor element is wetted with liquid when the element formation layer is separated from a substrate.

In addition, in the present invention, a release layer is preferably provided so as to perform peeling easily by applying force in order that the element formation layer is separated from the substrate by applying force to the element formation layer or the like. One feature of another method for manufacturing a semiconductor device of the present invention is that the release layer is formed over the substrate, the element formation layer including the semiconductor element is formed over the release layer, and force is applied, so that peeling is generated at an interface between the release layer and the element formation layer, and the element formation layer is separated from the substrate while a surface which appears by peeling is being wetted with liquid or moistened.

A portion where peeling is generated may be not only at the interface between the release layer and the element formation layer but also at an interface between the release layer and the substrate, or the inside of the release layer.

In order to wet (including to moisten) the surface which appears by peeling with liquid, liquid may be supplied to a surface which sequentially appears by peeling. One method for supplying liquid is a method for dropping or pouring liquid. Another method is a method for spraying liquid in an atomized form or in a vaporized form. Another method is a method for separating the element formation layer from the substrate while the substrate is being immersed in liquid. Another method is a method for releasing liquid from liquid holding means while the element formation layer is being separated when the liquid holding means such as sponge or cloth containing liquid is put in a gap generated by peeling.

As liquid for wetting the element formation layer or the like, liquid which does not deteriorate a material that forms the element formation layer, the release layer, and the substrate; or liquid which does not produce a product by reacting with these materials is preferably used. This is because a reaction product might contaminate the semiconductor device and a step of washing the reaction product is needed. As liquid, liquid which does not function as an etchant with respect to the element formation layer, the release layer, and the substrate is preferably selected.

As liquid which is used for a method for manufacturing a semiconductor device of the present invention, pure water can be used. In addition, as liquid, an aqueous solution which has lower resistivity than pure water can be used. That is, an aqueous solution in which a substance is dissolved in water as a medium can be used. The property of an aqueous solution may be any of acid, alkaline, or neutral. For example, an aqueous solution in which acid or a base is dissolved, an aqueous solution in which salt (salt may be any of acid salt, alkaline salt, and normal salt) is dissolved, or the like can be used.

As a substance which is dissolved in water, molecules which become gas at normal temperature (25° C.) under atmospheric pressure are preferably used. As such a substance, there are carbon dioxide and hydrogen chloride, for example. In the case where a substance is salt, it is preferable to use salt which functions as a surfactant, because a surface can be easily wetted when the surfactant is dissolved in water.

In addition, liquid used for a method for manufacturing a semiconductor device of the present invention is a mixed solution of water and volatile liquid, and desirably contains at least 0.1% water. An organic solvent such as ethanol or acetone can be used for volatile liquid.

In addition, a technique of the present invention is not limited to a method for manufacturing a semiconductor device and can be used for a method for manufacturing a structural object including a step of separating a structure in which one layer or a plurality of layers are stacked from a substrate. That is, the present invention relates to a method for manufacturing a structural object in which a structural layer including one layer or a plurality of layers is separated from the substrate, and has a feature in which a surface that appears by separating the structural layer from the substrate is wetted with liquid. When the structural object is manufactured, similarly to the semiconductor device of the present invention, the release layer is preferably provided between the substrate and the structural layer.

Discharge is a phenomenon in which a current instantaneously flows to a portion where a current does not flow normally, such as an insulator or a semiconductor, due to a high potential difference. By wetting or moistening a surface which appears by peeling, electrical resistance of the surface can be reduced. As a result of decreasing electrical resistance, electric charge which is generated by peeling electrification diffuses on the wetted surface; therefore, a potential can be prevented from being increased as a potential of the surface which appears by peeling generates discharge. That is, according to the present invention, discharge due to peeling electrification can be prevented.

According to the present invention, since discharge due to peeling electrification is not generated, yield can be improved in a method for manufacturing the semiconductor device including a step of separating the substrate and the element formation layer. In addition, since characteristic deterioration of the semiconductor element due to the electrostatic breakdown can be eliminated, reliability of the semiconductor device can be improved according to the present invention.

In addition, electric charge generated by peeling cannot be discharged either inside of two separated layers by the method of the present invention. Therefore, even when a lower surface of the element formation layer is formed of an insulating material, the semiconductor element included in the element formation layer can be prevented from being destroyed by static electricity generated due to peeling electrification and characteristics of the semiconductor element can be prevented from being deteriorated.

BRIEF DESCRIPTION OF THE DRAWINGS

FIG. 30A is a front elevation of a liquid crystal module, and FIG. 30B is a cross-sectional view of the liquid crystal module.

FIG. 31A is a front elevation of an EL module, and FIG. 31B is a cross-sectional view of the EL module.

FIGS. 32A and 32B are outside views of a television device, and FIG. 32C is an outside view of an e-book reader.

DETAILED DESCRIPTION OF THE INVENTION

Embodiment Mode

Figure 1:
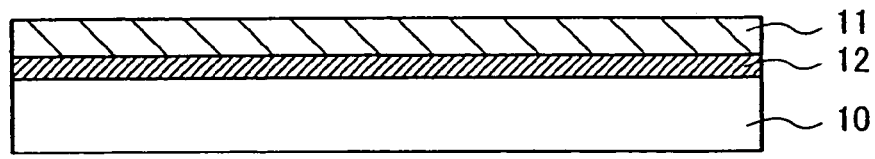
FIG. 1 is a cross-sectional view for illustrating a method for manufacturing a semiconductor device and is a diagram to illustrate that an element formation layer 11 is formed over a substrate 10.

Hereinafter, embodiment mode and examples of the present invention will be described with reference to the accompanying drawings. The same element is denoted with the same reference numeral and the redundant description is omitted. The present invention can be implemented in various modes. As can be easily understood by a person skilled in the art, the modes and details of the present invention can be changed in various ways without departing from the spirit and scope of the present invention. Thus, the present invention should not be interpreted as being limited to the following description of the embodiment mode and examples.

When static electricity is generated on a surface of a layer (also including a substrate) formed of a high resistance substance, such as an insulator, electric charge remains in a position where the electric charge is generated if there is no path through which the electric charge diffuses. When peeling proceeds and a potential due to the generated electric charge increases in this state, discharge occurs to a path through which electricity passes easily, for example, inside an element formation layer.

Therefore, a method for manufacturing a semiconductor device of the present invention has a feature in which means that does not charge electric charge generated by peeling is provided. Specifically, when an element formation layer is separated from a substrate, a surface which appears by separating the element formation layer is wetted or moistened by supplying liquid between two separated layers (there is the case where one layer is a substrate). The method for manufacturing the semiconductor device of the present invention will be described with reference to FIGS. 1 to 7.

As shown in FIG. 1, the element formation layer 11 is formed over the substrate 10. The release layer 12 is formed over the substrate 10, and the element formation layer 11 is formed over the release layer 12 so that the element formation layer 11 can be easily separated from the substrate 10.

In the element formation layer 11, at least one semiconductor element is formed. For example, an integrated circuit formed of a thin film transistor, a diode, a resistor, a capacitor, or the like is formed in the element formation layer 11. The element formation layer 11 is one of components of the semiconductor device.

The release layer 12 can be formed of metal or alloy, for example. Metal is tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or the like. Alloy is alloy of a plurality of metal elements selected from these metal elements such as alloy of tungsten and molybdenum. A metal film and an alloy film of the element can be formed by a sputtering method. In addition, the thickness of the metal film or alloy film to serve as the release layer 12 may lie within the range of 20 nm to 100 nm.

In order to generate peeling preferentially between the element formation layer 11 and the release layer 12, a surface of the metal film or alloy film which is formed as the release layer 12 is oxidized. As a method for oxidation, there are a thermal oxidation method, a method for treating a surface with oxygen or $N_2O$ plasma, a method for treating a surface with a solution having strong oxidizability, such as ozone water, and the like. Another method is a method for forming an oxide at the interface between the element formation layer 11 and the release layer 12 when the element formation layer 11 is formed. For example, in the case where a silicon oxide is formed by a sputtering method, a surface of the metal film or alloy film can be oxidized when the silicon oxide is deposited on the surface of the metal film or alloy film. Note that, instead of being oxidized the metal film or alloy film, the metal film or alloy film may be nitrided by plasma treatment or heat treatment.

In addition, the release layer 12 can be formed of a single layer or a plurality of layers. For example, the release layer 12 can be formed of a multi-layer film having an insulating film formed of an inorganic material such as a silicon oxide or a silicon oxynitride and a metal film (or an alloy film), so as not to generate peeling at the interface between the substrate 10 and the release layer 12.

The substrate 10 is a substrate used for forming the element formation layer 11 and the release layer 12 and is preferably a rigid body. The substrate 10 is formed of, for example, a glass substrate, a quartz substrate, a metal substrate, a stainless steel substrate, a silicon wafer on which an insulating layer is formed, or the like.

Figure 2:
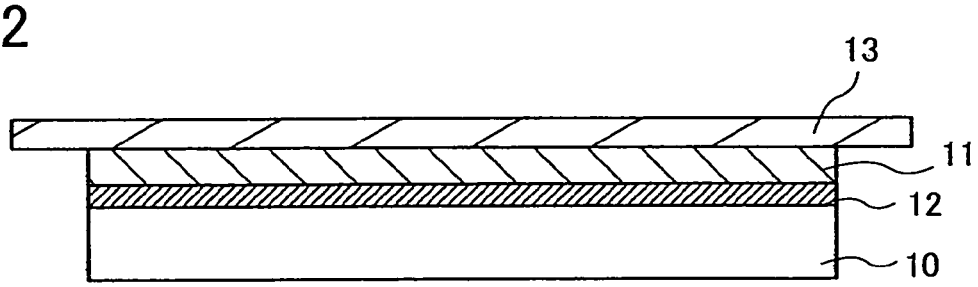
FIG. 2 is a cross-sectional view for illustrating a method for manufacturing a semiconductor device and is a diagram to illustrate that a support base material 13 is fixed to the upper surface of the element formation layer 11.

After the element formation layer 11 is formed, as shown in FIG. 2, the support base material 13 is fixed on the element formation layer 11. The support base material 13 is a member to facilitate handling of the element formation layer 11 after separation from the substrate 10. In addition, the support base material 13 is also a member to facilitate operation to transform the element formation layer 11 when the element formation layer 11 is separated from the substrate 10.

In the case where the support base material 13 is not a member of a semiconductor device but is removed in a manufacturing process of the semiconductor device, a base material capable of separation without damaging the element formation layer 11 is used for the support base material 13. In addition, the support base material 13 preferably has flexibility so as to transform the element formation layer 11. Therefore, a release film which can be peeled with weak force may be used for the support base material 13.

Note that, when the support base material 13 is used as the member of the semiconductor device, a plastic substrate and the like formed of polycarbonate, polyarylate, polyethersulfone, or the like are given. In addition, a flexible film (formed of polypropylene, polyester, vinyl, polyvinyl fluoride, polyvinyl chloride, or the like) is used as the support base material 13 and is attached to the element formation layer 11 with an adhesive agent such as an epoxy resin in a structure of FIG. 2.

Figure 3:
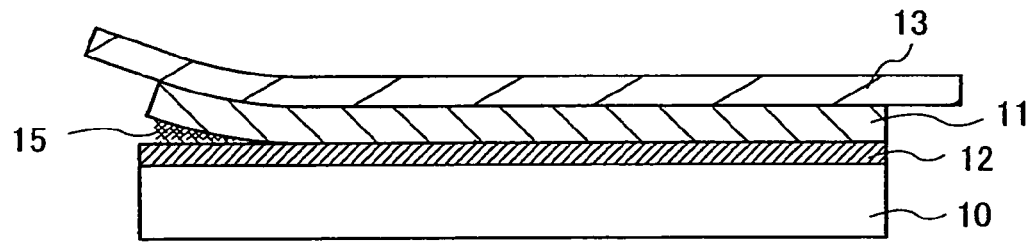
FIG. 3 is a cross-sectional view for illustrating a method for manufacturing a semiconductor device and is a cross-sectional view to illustrate that peeling is generated at an interface between the element formation layer 11 and a release layer 12.

As shown in FIG. 3, peeling is generated at the interface between the element formation layer 11 and the release layer 12. Since peeling is generated, mechanical external force (so-called force in accordance with a law of classical mechanics) is provided to this interface. For example, as shown in FIG. 3, the element formation layer 11 is transformed by bending the support base material 13, so that peeling can be generated at an end portion of the interface between the element formation layer 11 and the release layer 12. Note that since it is difficult to bend the release layer 12 because the substrate 10 is a rigid body, the element formation layer 11 is transformed; however, the release layer 12 may be transformed or both the element formation layer 11 and the release layer 12 may be transformed, as long as the release layer 12 is easily transformed.

The mechanical external force which can transform the element formation layer 11 can be applied by human hands or by pinching the support base material 13 with a holding device such as tweezers. In addition, the element formation layer 11 can be transformed by twining the support base material 13 around a roller or the like to be described later.

As shown in FIG. 3, when peeling is generated at the end portion of the interface between the element formation layer 11 and the release layer 12, liquid 15 is supplied in a gap generated by peeling, and a lower surface of the element formation layer 11 and the upper surface of the release layer 12 which appear by peeling are wetted. Note that, when the substrate 10 comes on the bottom and the support base material 13 comes on the top, the lower surface means a surface of the layer on the substrate 10 side and the upper surface means a surface of the layer on a support base material 13 side.

Figure 4:
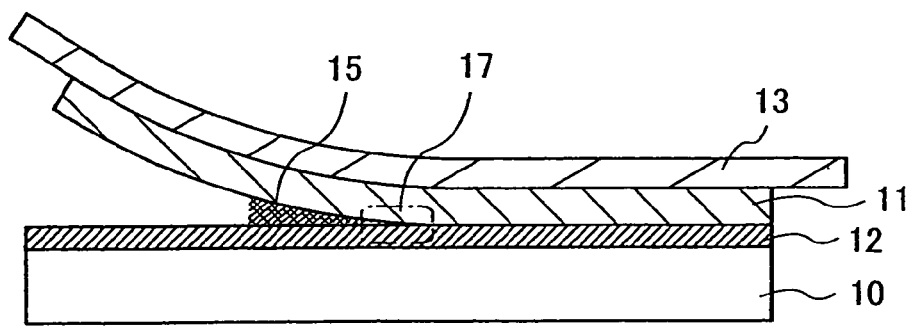
FIG. 4 is a cross-sectional view for illustrating a method for manufacturing a semiconductor device and is a diagram showing that peeling proceeds more than FIG. 3 at an interface between the element formation layer 11 and the release layer 12.

In the present invention, as shown in FIG. 4, while the element formation layer 11 is being peeled, the liquid 15 is supplied to a tip portion of peeling (a portion 17 surrounded with a chain line of FIG. 4) so that the lower surface of the element formation layer 11 and the upper surface of the release layer 12 which sequentially appear by peeling are wetted with the liquid 15.

In the present invention, pure water can be used for the liquid 15. Although resistivity of pure water is 1 MΩ·cm or more, which is very high, an impurity is mixed with pure water when pure water comes into contact with the element formation layer 11 or the release layer 12, and electrical resistance decreases. Therefore, by wetting the lower surface of the element formation layer 11 and the upper surface of the release layer 12 which appear by peeling with pure water, electric charge generated by peeling can be diffused on the lower surface of the element formation layer 11 and the upper surface of the release layer 12. Accordingly, even when the surfaces of the element formation layer 11 and the release layer 12 are formed of a high resistance material, discharge toward the inside of the element formation layer 11 and the release layer 12 can be avoided.

That is, in the present invention, by supplying the liquid 15 to the portion where peeling is to be generated, a surface which appears by peeling is wetted with the liquid, and electrical resistance of the surface is reduced, at the same time as generation of peeling. Thus, in the present invention, since electric charge due to peeling electrification can be diffused at the moment when peeling is generated, discharge due to static electricity can be prevented.

In addition, as the liquid 15, an aqueous solution which has lower resistivity than pure water can be used. The property of an aqueous solution may be any of acid, alkaline, or neutral. For example, an aqueous solution in which acid or a base is dissolved, an aqueous solution in which salt (salt may be any of acid salt, alkaline salt, and normal salt) is dissolved, or the like can be used. As an aqueous solution which can be used as the liquid 15, specifically, an aqueous solution of carbon dioxide ($CO_2$), an aqueous solution of hydrochloric acid (HCl), an aqueous solution of tetramethylammonium hydroxide, an aqueous solution of ammonium chloride ($NH_4Cl$), and the like are given as examples.

As the liquid 15, it is preferable to use an aqueous solution in which molecules that become gas at normal temperature (25° C.) under atmospheric pressure are dissolved in water, such as an aqueous solution of carbon dioxide or an aqueous solution of hydrogen chloride. This is because the molecules which are dissolved with water become gas and does not remain when the liquid 15 is dried. In addition, when an aqueous solution in which salt is dissolved is used, it is preferable to use salt which functions as a surfactant, because a surface can be easily wetted with the liquid 15 when the surfactant is dissolved.

In addition, a mixed solution of water and volatile liquid can also be used as the liquid 15. By containing volatile liquid in the liquid 15, drying treatment can be omitted. As long as volatile liquid contains at least about 0.1% water, electric charge can be diffused by the liquid 15, that is, an antistatic effect can be obtained. Since some organic solvent such as commercial high-purity ethanol or acetone contains water at a concentration of 0.1% or more as an impurity, such a commercial organic solvent can be used as a mixed solution of water and volatile liquid of the present invention, without controlling the concentration. In addition, in order to take advantage of volatile liquid, the concentration of the volatile liquid is preferably 30% or more. Accordingly, a low purity organic solvent, such as denatured ethanol which is widespread as an organic solvent can also be used as the mixed solution of water and volatile liquid of the present invention, without controlling the concentration.

Figure 5:
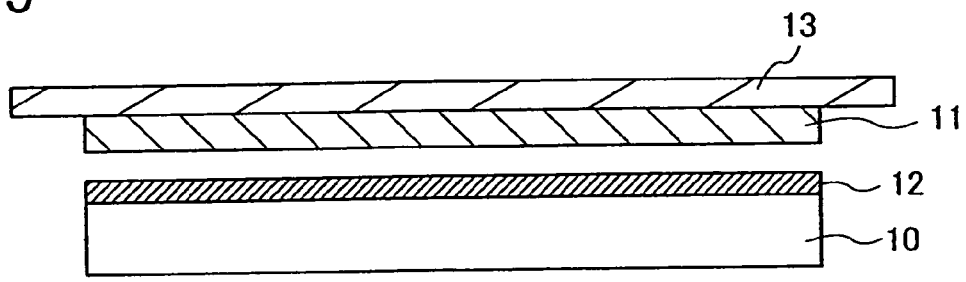
FIG. 5 is a cross-sectional view for illustrating a method for manufacturing a semiconductor device and is a diagram showing that the element formation layer 11 is separated from the substrate 10.
Figure 6:
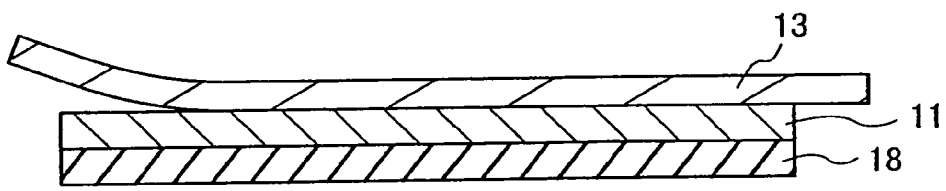
FIG. 6 is a cross-sectional view for illustrating a method for manufacturing a semiconductor device and is a diagram to illustrate that a first flexible substrate 18 is fixed to a lower surface of the element formation layer 11 and the support base material 13 is removed.

As shown in FIG. 5, when peeling between the element formation layer 11 and the release layer 12 is completed, the substrate 10 with the release layer 12 is peeled from the element formation layer 11. As shown in FIG. 6, the first flexible substrate 18 is fixed to the lower surface of the element formation layer 11 with an adhesive agent. Next, the support base material 13 is peeled from the upper surface of the element formation layer 11. When the support base material 13 is peeled, the liquid 15 may be supplied between the element formation layer 11 and the support base material 13, in a similar manner that the liquid 15 is supplied between the element formation layer 11 and the release layer 12, in the case where the element formation layer 11 might be destroyed by peeling electrification.

Figure 7:
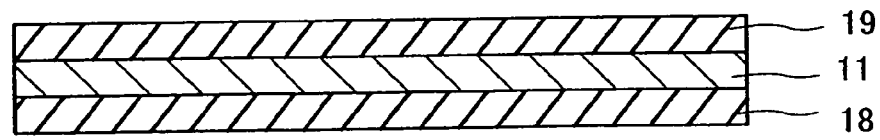
FIG. 7 is a cross-sectional view of a semiconductor device manufactured by a manufacturing method of the present invention.

Next, as shown in FIG. 7, a second flexible substrate 19 is fixed to the upper surface of the element formation layer 11. The second flexible substrate 19 may be provided, as necessary. By the above-described manufacturing method, a flexible semiconductor device having the element formation layer 11 shown in FIG. 7 can be manufactured.

The first flexible substrate 18 and the second flexible substrate 19 each are a base material which can be bent or curved. As these flexible substrates 18 and 19, a plastic substrate formed of polycarbonate, polyarylate, polyethersulfone, or the like can be used, for example. In addition, a film formed of an organic compound such as polyethylene terephthalate, polypropylene, polyester, vinyl, polyvinyl fluoride, or polyvinyl chloride can be used.

The first flexible substrate 18 and the second flexible substrate 19 are fixed to the element formation layer 11 by using an adhesive agent in which adhesiveness is developed by heating or irradiation with visible light or ultraviolet light, and after cooling, the adhesive agent is cured to attach an object. For example, a resin such as a thermoplastic resin or a photopolymerizable resin can be used as an adhesive agent.

In the present invention, the liquid 15 is sequentially supplied to the tip portion of peeling which is surrounded with the chain line of FIG. 4 (the portion 17 surrounded with the chain line of FIG. 4). In other words, the liquid may be supplied to a surface which sequentially appears by peeling. One method for supplying liquid is a method for dropping or pouring the liquid 15 in a gap generated by peeling with injection means such as a nozzle or a dropper. In this case, the liquid 15 may always be supplied from start to end of peeling or may be supplied intermittently. In addition, when the liquid 15 is poured or dropped only at an early stage of peeling as shown in FIG. 3, the supplied liquid 15 can be spread to the tip portion of peeling (the portion 17 surrounded with the chain line of FIG. 4) due to a capillary phenomenon, as peeling proceeds.

Another method for supplying the liquid 15 is a method for spraying the liquid 15 in an atomized form with spray means such as a spray nozzle or a sprayer. By this method, while peeling proceeds, the liquid 15 may always be sprayed, may be sprayed intermittently, or may be sprayed only at an early stage of peeling. Note that when pure water is used as the liquid 15, the liquid 15 in the form of moisture can be sprayed.

Another method for supplying the liquid 15 is a method in which a liquid hold medium that can absorb liquid and release the liquid by applying external force, such as sponge or cloth, is used.

In addition, another method for supplying the liquid 15 is a method in which the liquid 15 is put in a container and the element formation layer 11 is separated from the substrate 10 while the substrate 10 is being immersed in the liquid 15. In this case, a portion where peeling proceeds is immersed in the liquid 15, so that the liquid 15 can be spread to the tip portion of peeling (the portion 17 surrounded with the chain line of FIG. 4).

Here, a method for supplying the liquid 15 by using a liquid hold medium will be described with reference to cross-sectional views shown in FIGS. 1 to 4, 8, and 9. Note that another supplying method will be described in detail in the following example.

By performing the steps shown in FIGS. 1 and 2, the release layer 12 and the element formation layer 11 are formed over the substrate 10, and the support base material 13 is fixed on the element formation layer 11. As shown in FIG. 3, by bending the support base material 13, peeling is generated at the interface between the element formation layer 11 and the release layer 12.

Figure 8:
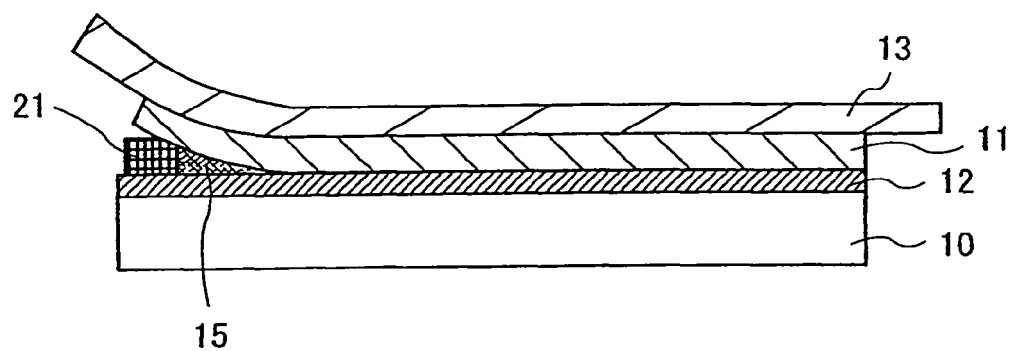
FIG. 8 is a cross-sectional view for illustrating a method for manufacturing a semiconductor device and is a diagram to illustrate that liquid is supplied by using liquid holding means.

Next, as shown in FIG. 8, liquid holding means 21 containing the liquid 15 is inserted in a gap generated by peeling. Note that, after the liquid holding means 21 is inserted in the gap, the liquid 15 may be supplied with a dropper or a nozzle, and the liquid holding means 21 may contain the liquid 15. As the liquid holding means 21, one having a function to absorb liquid such as sponge or cloth can be used.

In FIG. 8, as for the size of the liquid holding means 21, it is desirable that the length in a direction perpendicular to paper be longer than the length of one side of the substrate 10 in this direction and an end portion of the liquid holding means 21 not be over the substrate 10.

Figure 9:
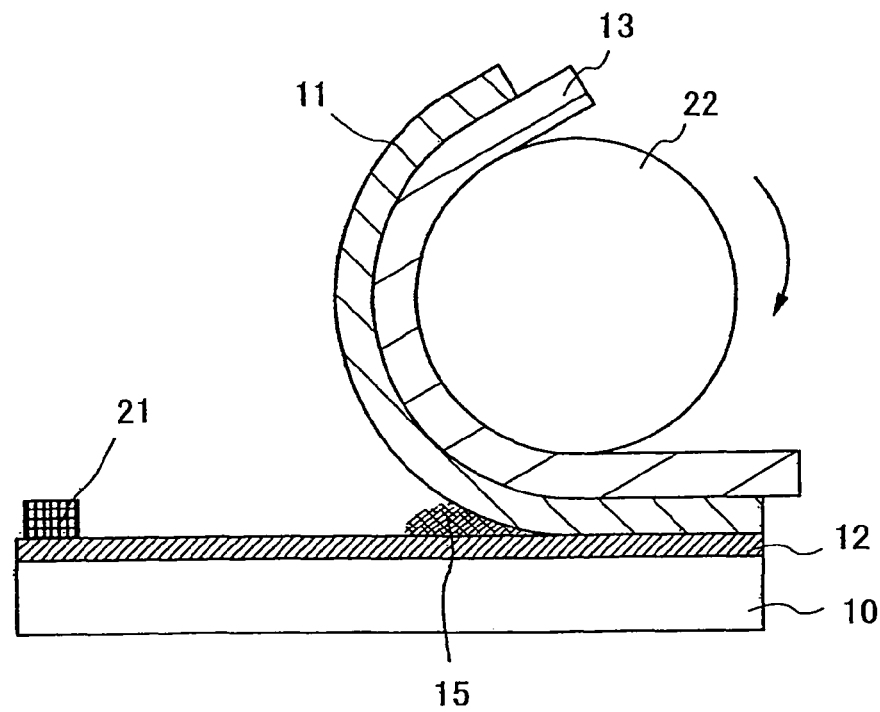
FIG. 9 is a cross-sectional view for illustrating a method for manufacturing a semiconductor device and is a diagram to illustrate that liquid is supplied by using liquid holding means.

Furthermore, peeling proceeds by applying mechanical force to the interface between the element formation layer 11 and the release layer 12 through the support base material 13. As an example of a method for applying mechanical force, a method for winding the element formation layer 11 by using a roller 22 will be described. As shown in FIG. 9, the roller 22 is rolled on the support base material 13 and the element formation layer 11 with the support base material 13 is wound, so that the element formation layer 11 can be separated from the substrate 10.

When the roller 22 passes over the liquid holding means 21, the liquid 15 contained in the liquid holding means 21 is pushed out due to the self-weight of the roller 22, and a portion to be peeled comes into contact with the liquid 15. That is, the upper surface of the release layer 12 and the lower surface of the element formation layer 11 which appear as the roller 22 is rotated can be wetted sequentially with the liquid 15. Therefore, electric charge generated by peeling can be diffused by the liquid 15 at the moment when peeling is generated, and electric charge can be prevented.

The method for manufacturing the semiconductor device of the present invention is described using the case where the release layer 12 is the metal film or the alloy film, as an example. However, the present invention is not limited to this example. A release layer may be formed of a material so that an element formation layer can be peeled by applying mechanical force.

The method for manufacturing the semiconductor device of the present invention is described using the case where peeling is generated at the interface between the element formation layer 11 and the release layer 12, as an example. However, a portion where peeling is generated is not limited thereto. For example, as the release layer 12, an amorphous silicon film containing hydrogen is formed using silane gas as a raw material over the substrate 10 by a plasma CVD method. A laser beam in the ultraviolet region, such as an excimer laser beam is emitted from the substrate 10 side, and hydrogen is released from the amorphous silicon film. Thus, adhesion of the amorphous silicon film and the substrate 10 decreases, or the amorphous silicon film itself becomes fragile; therefore, peeling can be generated at the interface between the release layer 12 and the substrate 10 or inside the release layer 12.

In addition, by providing the release layer 12 as a multilayer of different materials, peeling can also be generated at an interface of a layer which forms a release layer. For example, as the release layer 12, a tungsten film is formed by a sputtering method, and a silicon dioxide film is formed over the tungsten film by a sputtering method. When the silicon dioxide film is deposited, a tungsten oxide is generated at an interface between the tungsten film and the silicon dioxide film. Accordingly, since junction at the interface between the tungsten film and the silicon dioxide film is weak, peeling can be generated between the tungsten film and the silicon dioxide film, by applying force to the release layer 12.

Example 1

In this example, a method for manufacturing a semiconductor device capable of inputting and outputting data by noncontact, to which the present invention is applied, will be described. In this example, an element formation layer was provided with an integrated circuit which performs wireless communication using a 13.56 MHz signal and functions as an IC tag. This example will be described with reference to FIGS. 10 to 20, and 25 to 28.

Figure 10:
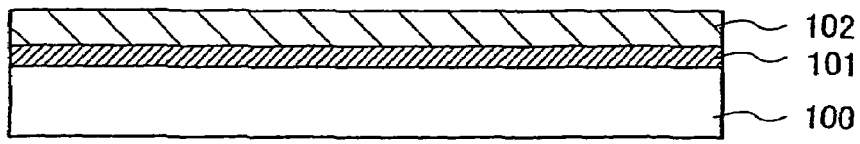
FIG. 10 is a cross-sectional view for illustrating a method for manufacturing a semiconductor device of Example 1 and is a cross-sectional view of a stack formed of a release layer 101 and an element formation layer 102 over a substrate 100.

As shown in FIG. 10, the release layer 101 was formed over the substrate 100, and an integrated circuit was formed over the release layer 101. A method for manufacturing the release layer 101 and the element formation layer 102 will be described with reference to FIGS. 25 to 28.

Figure 25:
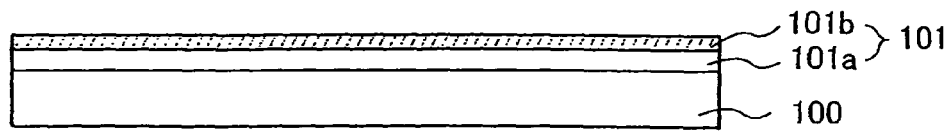
FIG. 25 is a cross-sectional view for illustrating a method for forming a release layer of Example 1.

As the substrate 100, a substrate in which a glass substrate (a thickness of 0.7 mm, product name: AN100) made by Asahi Glass Co., Ltd. was cut to 5 inches on each side was used. As shown in FIG. 25, the release layer 101 had a multilayer structure of a silicon oxynitride ($SiO_xN_y$, x<y) layer 101a and a tungsten layer 101b. The silicon oxynitride layer 101a was formed to have a thickness of 200 nm by using $SiH_4$ and $N_2O$ as source gas with a parallel plate plasma CVD apparatus. The tungsten layer 101b was formed to have a thickness of 50 nm by using a tungsten target with a sputtering apparatus. By generating $N_2O$ plasma, a surface of the tungsten layer 101b was subjected to plasma treatment and oxidized, and then a tungsten oxide was formed. With this plasma treatment, peeling comes to be generated at the tungsten oxide which is the interface between the release layer 101 and the element formation layer 102. In addition, when the tungsten layer 101b was formed by a sputtering method, the silicon oxynitride layer 101a which was a lower layer of the release layer 101 was a barrier layer for not diffusing an impurity from the substrate 100 (e.g., a glass substrate). As the barrier layer, an insulating film formed of another inorganic material such as silicon oxide or silicon nitride can be used.

Figure 26:
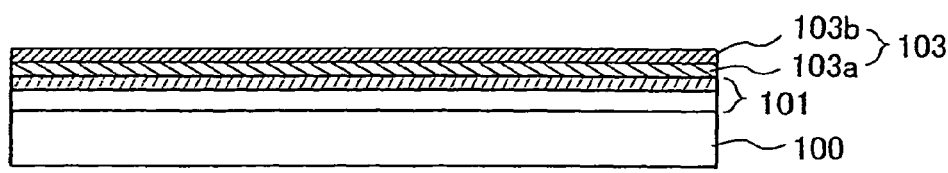
FIG. 26 is a cross-sectional view for illustrating a method for forming an element formation layer of Example 1 and is a diagram to illustrate that an insulating film 103 of an element formation layer is formed over the release layer 101.

As shown in FIG. 26, the insulating film 103 to serve as a base insulating layer of a semiconductor element such as a TFT of the element formation layer 102 was formed over the release layer 101. The insulating film 103 had a stacked structure of a silicon oxynitride ($SiO_xN_y$, x<y) layer 103a and a silicon oxynitride ($SiO_xN_y$, x>y) layer 103b. The first silicon oxynitride layer 103a was formed by using $SiH_4$, $N_2O$, $NH_3$, and $H_2$ as source gas with a parallel plate plasma CVD apparatus. The second silicon oxynitride layer 103b was formed by using $SiH_4$ and $N_2O$ as source gas with a parallel plate plasma CVD apparatus.

Figure 27:
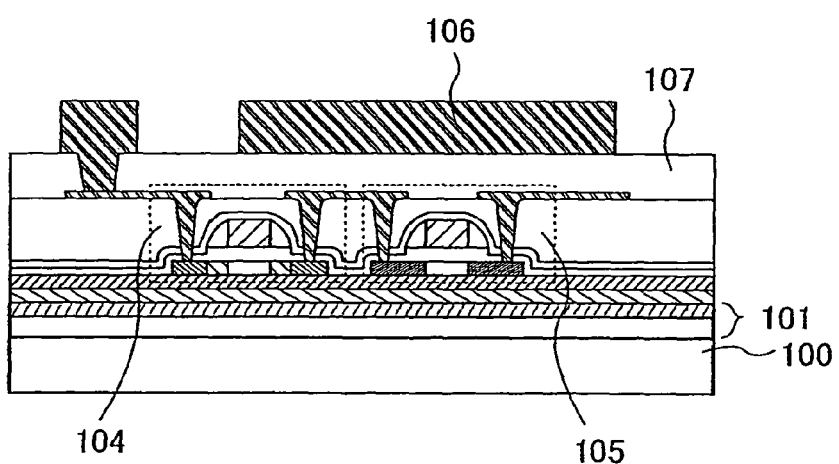
FIG. 27 is a cross-sectional view for illustrating a method for forming an element formation layer of Example 1 and is a diagram to illustrate that an integrated circuit including a thin film transistor is formed over the insulating film 103.

As shown in FIG. 27, an integrated circuit was formed of a semiconductor element such as a TFT or a capacitor over the insulating film 103. In FIG. 27, as a cross-sectional view of the integrated circuit, only a CMOS circuit formed of an n-channel TFT 104 and a p-channel TFT 105 was illustrated. Note that 48 (8 rows×6 columns) integrated circuits which were arranged in matrix were formed over one substrate 100 at the same time.

An antenna 106 connected to the integrated circuit (the TFTs 104 and 105) was formed for wireless communication. First, before the antenna 106 was formed, an insulating film 107 was formed to cover the integrated circuit (the TFTs 104 and 105). In this example, the insulating film 107 was formed of photosensitive polyimide, and an opening for connecting the antenna 106 was formed in the insulating film 107.

Over the insulating film 107, a silver (Ag) paste was formed into a desired shape by a printing method, and the antenna 106 was formed. Note that, of 48 integrated circuits formed over the substrate 100, half of them were provided with the antenna 106, and a stack of the integrated circuit and the antenna was formed. In addition, the other half of them were provided with a bump for connecting an external antenna by using a silver paste, instead of the antenna 106. Note that the antenna 106 and the bump can be formed in such a way that a conductive film such as aluminum is formed by a sputtering method and processed into a desired shape by an etching method.

Figure 28:
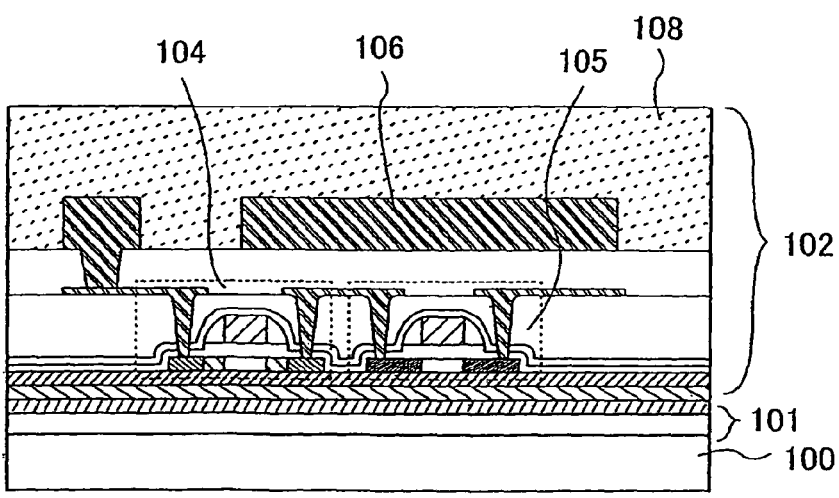
FIG. 28 is a cross-sectional view for illustrating a method for forming an element formation layer of Example 1 and is a cross-sectional view of the element formation layer 102.

Lastly, a resin layer 108 for sealing was formed to cover the antenna 106, as shown in FIG. 28. As the resin layer 108, an epoxy resin layer having a thickness of 30 μm was formed. As described above, a structural object formed of the release layer 101 and the element formation layer 102 was formed over the substrate 100.

Figure 11:
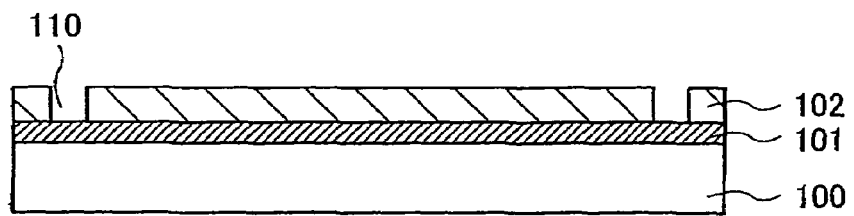
FIG. 11 is a cross-sectional view for illustrating a method for manufacturing a semiconductor device of Example 1 and is a diagram to illustrate that a groove 110 is formed in the element formation layer 102.

A plurality of integrated circuits is formed in the element formation layer 102 over the substrate 100. When the element formation layer 102 was separated from the substrate 100, a groove 110 is formed in the element formation layer 102 in advance as shown in FIG. 11, so that integrated circuits can be separated from one another. The groove 110 is formed so as to surround the periphery of each integrated circuit in the element formation layer 102. In this example, the groove 110 was formed by emitting a UV laser beam having a wavelength of 266 nm and an output of 2 W.

By forming the groove 110 in the element formation layer 102, peeling was slightly generated at the interface between the element formation layer 102 and the release layer 101 which were exposed by the groove 110, which led to a state that the element formation layer 102 floated along the groove 110.

Figure 12:
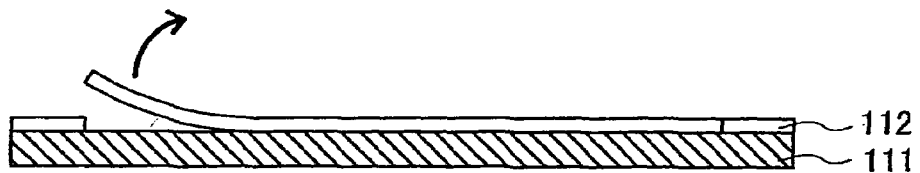
FIG. 12 is a cross-sectional view for illustrating a method for manufacturing a semiconductor device of Example 1 and is a diagram to illustrate that part of a separate film 112 is removed from a heat release film 111.

A heat release film to serve as a support base material is prepared in peeling. The heat release film 111 is a 100-μm-thick film formed of polyethylene terephthalate, and one surface of the film is provided with a thermosetting resin layer having a thickness of 50 μm. The thermosetting resin layer functions as an adhesive layer before heat curing, and the surface of the thermosetting resin layer is protected with the separate film 112. In order to fix the heat release film 111 to the element formation layer 102 by using the thermosetting resin layer, part of the separate film 112 was removed, as shown in FIG. 12. Accordingly, the separate film 112 was irradiated with a UV laser beam, and a cut similar to the groove 110 formed in the element formation layer 102 was made, so that the separate film 112 inside the cut was peeled.

Figure 13:
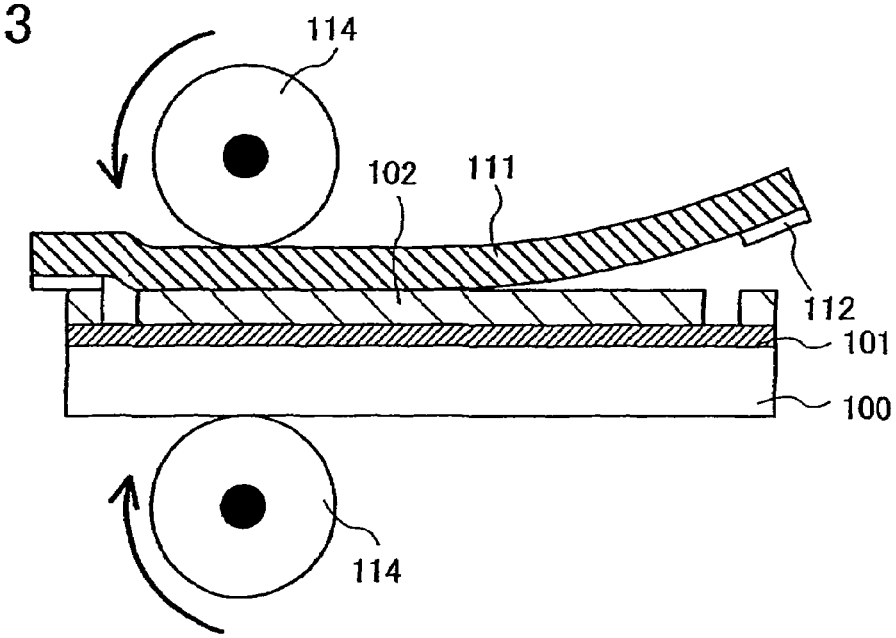
FIG. 13 is a cross-sectional view for illustrating a method for manufacturing a semiconductor device of Example 1 and is a diagram for illustrating a method for fixing the heat release film 111 to the element formation layer 102.

The heat release film 111 is attached to the upper surface of the element formation layer 102. As shown in FIG. 13, by using a commercial laminator provided with a pair of rollers 114, the heat release film 111 was attached to the element formation layer 102. The heat release film 111 is attached to a portion (a portion to serve as an object of peeling) of the element formation layer 102 to form a semiconductor device eventually, by using the thermosetting resin layer (adhesive layer). On the other hand, the heat release film 111 is not attached to a portion (a portion which does not serve as a separation object) where the semiconductor device is not formed because the separate film 112 remains.

Figure 14:
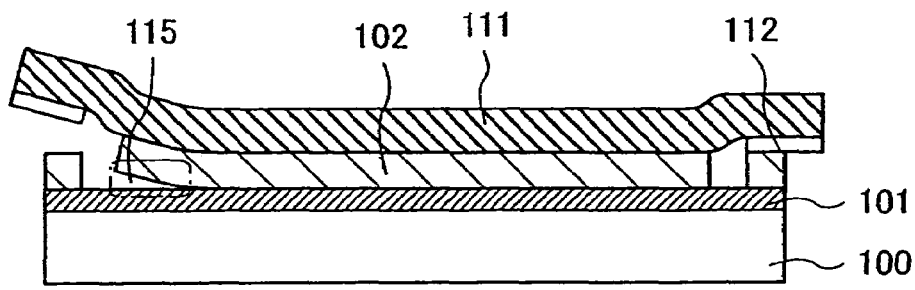
FIG. 14 is a cross-sectional view for illustrating a method for manufacturing a semiconductor device of Example 1 and is a diagram for illustrating a method for widening a gap 115 between the element formation layer 102 and the release layer 101.

At the periphery of the groove 110, there is a state that the element formation layer 102 is floated slightly from the release layer 101, when peeling is generated. In the case where a gap between the element formation layer 102 and the release layer 101, into which liquid is dropped, is small, the gap is widened. In this example, plastic tweezers were inserted into the peeled lower surface of the element formation layer 102, and as shown in FIG. 14, the gap 115 was generated between an upper surface of the release layer 101 and the lower surface of the element formation layer 102.

Figure 15:
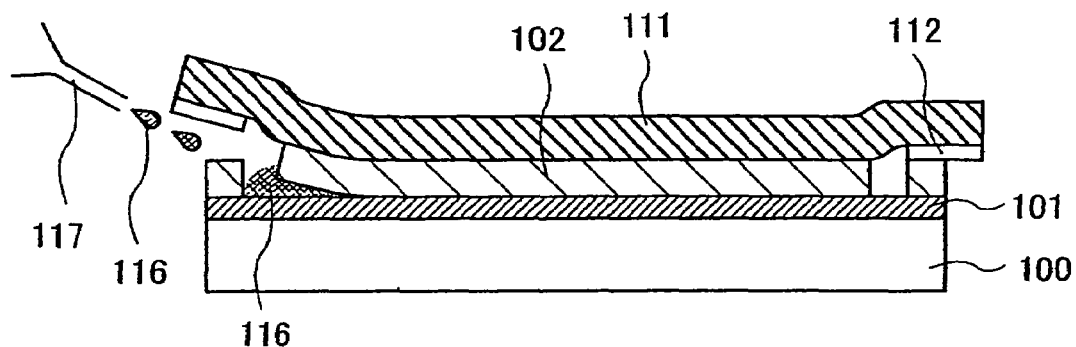
FIG. 15 is a cross-sectional view for illustrating a method for manufacturing a semiconductor device of Example 1 and is a diagram for illustrating a method for supplying liquid 116 to the gap 115 between the element formation layer 102 and the release layer 101.

As shown in FIG. 15, the liquid 116 is dropped into the gap 115 between the release layer 101 and the element formation layer 102. In this example, the liquid 116 was dropped with a dropper 117. A sufficient amount of the liquid 116 to be diffused into the gap 115 was poured. In the following step, the liquid 116 is not supplied.

In addition, as the liquid 116, pure water, pure water in which $CO_2$ is dissolved (hereinafter referred to as "$CO_2$ water"), pure water in which hydrogen chloride is dissolved (hereinafter referred to as "HCl water"), and ethanol were used. Note that an aqueous solution having resistivity of 0.2 MΩ·cm was used as $CO_2$ water. An aqueous solution having a hydrogen chloride concentration of 180 ppm was used as HCl water. A commercial ethanol having an ethanol concentration of 99.5% and a water concentration of 0.5% was used without controlling concentration.

Figure 16:
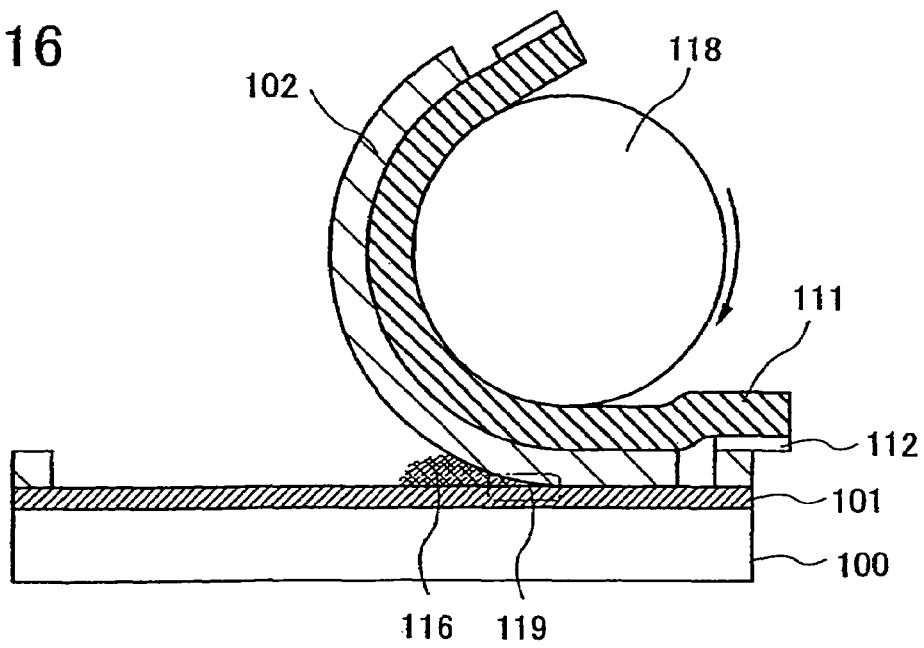
FIG. 16 is a cross-sectional view for illustrating a method for manufacturing a semiconductor device of Example 1 and is a diagram for illustrating a method for separating the element formation layer 102 from the substrate 100 while the liquid 116 is being supplied.

As shown in FIG. 16, when a non-conductive roller 118 was rolled on the heat release film 111, the element formation layer 102 with the heat release film 111 was twined around the roller 118 and the element formation layer 102 was separated from the substrate 100. When the roller 118 is rotated, the element formation layer 102 is peeled sequentially from the release layer 101, and the liquid 116 supplied in the state shown in FIG. 15 moves to a portion 119 (a tip portion of peeling) where the element formation layer 102 is to be peeled, by using a capillary phenomenon. Therefore, the lower surface of the element formation layer 102 and the upper surface of the release layer 101 which appeared by peeling were able to be wetted with the liquid 116, at the moment when peeling was generated.

Figure 17:
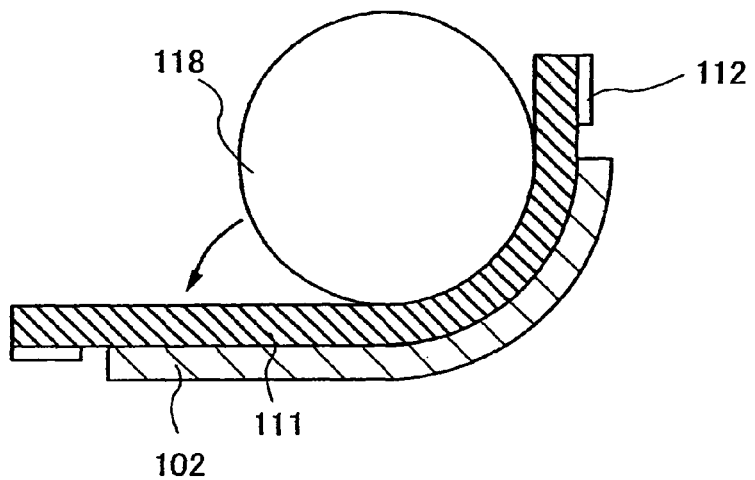
FIG. 17 is a cross-sectional view for illustrating a method for manufacturing a semiconductor device of Example 1 and is a diagram to illustrate that the element formation layer 102 is separated from the substrate 100.
Figure 18:
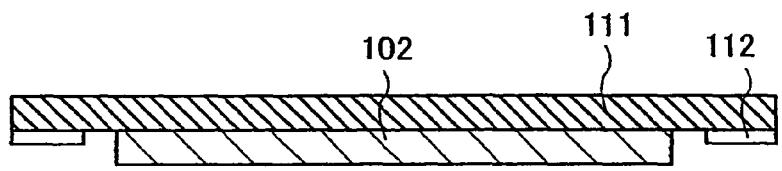
FIG. 18 is a cross-sectional view for illustrating a method for manufacturing a semiconductor device of Example 1 and is a cross-sectional view of the separated element formation layer 102 which is held by the heat release film 111.

Next, as shown in FIG. 17, the element formation layer 102 and the heat release film 111 which was coherent to the roller 118 were peeled. As shown in FIG. 18, the element formation layer 102 provided with the heat release film 111, which is separated from the substrate 100 can be obtained. In the case where pure water, $CO_2$ water, and HCl water were used as the liquid 116, the heat release film 111 and the element formation layer 102 were dried by using an air blow device.

When the heat release film 111 is peeled from the roller 118 (see FIG. 17), the liquid 116 may be supplied between the roller 118 and the heat release film 111. In this example, it is confirmed that the element formation layer 102 can be peeled from the roller 118 without destroying the element formation layer 102, even when the liquid 116 is not poured. One of the reasons why the element formation layer 102 is not destroyed is that the insulating film 107 formed of an epoxy resin having a thickness of 30 μm is provided between the integrated circuit and the heat release film 111 in the element formation layer 102.

When the element formation layer 102 was observed by an optical microscope in a state of being provided with the heat release film 111 (a state of FIG. 18), it was checked whether power breakdown due to discharge (destruction in which a semiconductor layer, an insulating film, a conductive film, or the like is melted due to heat generated by discharge) was generated. An object of the observation with the optical microscope is to check whether visible destruction is not generated in the semiconductor element. In this example, all 48 integrated circuits formed over one substrate 100 were observed by the optical microscope.

Pure water, $CO_2$ water, HCl water, and ethanol were used as the liquid 116; however, as a result of the observation with the optical microscope, power breakdown was not generated in the integrated circuit, even with any of the liquid 116. On the other hand, when the element formation layer 102 was separated from the substrate 100 without supply of the liquid 116, there was an integrated circuit in which power breakdown was generated.

TABLE 1

Results of observations of integrated circuits in the element formation layer with the optical microscope.

| Kind of liquid | Number of observed substrates | Total number of observed integrated circuits | Total number of destroyed integrated circuits | Percentages of destroyed integrated circuits |
|---|---|---|---|---|
| Pure water | 3 | 144 | 0 | 0.0% |
| $CO_2$ water | 3 | 144 | 0 | 0.0% |
| HCl water | 1 | 48 | 0 | 0.0% |
| Without liquid | 4 | 192 | 59 | 30.7% |

Table 1 summarizes observations with the optical microscope. Table 1 shows observations of a substrate (a sample) to which the liquid 116 was supplied and a substrate (a sample) to which the liquid 116 was not supplied. As the liquid 116, pure water, $CO_2$ water, and HCl water were used. As shown in Table 1, when the liquid 116 was not supplied, destruction capable of being seen by appearance such as disconnection or film fusion was observed in 30% or more of integrated circuits. In addition, regularity was not found in distribution (a position formed with the substrate) of the integrated circuit in which destruction was generated over the substrate. Therefore, as for the substrate to which liquid is not supplied, a defective might be overlooked by sampling inspection. However, total inspection has a large burden in terms of cost or cycle time. By implementing the present invention, power breakdown due to peeling discharge can be prevented; therefore, the burden of inspection can be reduced.

After the state of FIG. 18 is obtained, a laminate film 121 which is a flexible substrate is attached to the lower surface of the element formation layer 102. After the resin layer is cured by heating the heat release film 111 to lose the adhesiveness of the resin layer, the heat release film 111 is peeled from the upper surface of the element formation layer 102. The element formation layer 102 with the laminate film 121 is divided into each integrated circuit. Another laminate film 122 is attached to the upper surface of the divided element formation layer 102. By heating while pressurizing, as shown in FIG. 19, a semiconductor device having the element formation layer 102 sealed with two laminate films 121 and 122 is manufactured.

Figure 20:
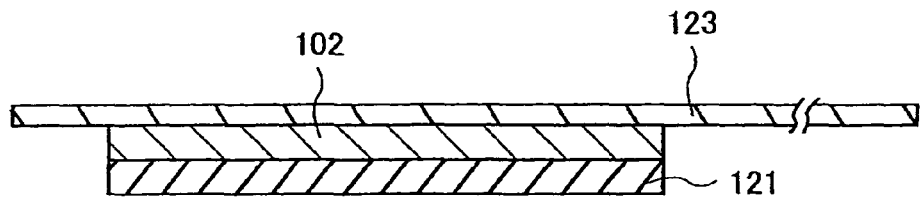
FIG. 20 is a cross-sectional view for illustrating a method for manufacturing a semiconductor device of Example 1 and is a cross-sectional view of the semiconductor device.

Note that, as shown in FIG. 20, a film 123 provided with an antenna is fixed to the element formation layer 102 including the circuit of the integrated circuits which is not connected to an antenna, instead of the laminate film 122, and a semiconductor device was manufactured. An anisotropic conductive adhesive is used to attach the film 123 and the element formation layer 102 to each other, and a terminal of the antenna over the film 123 is electrically connected to the bump of the integrated circuit.

Figure 19:
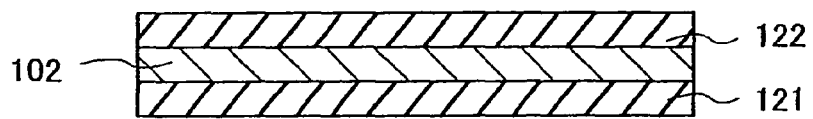
FIG. 19 is a cross-sectional view for illustrating a method for manufacturing a semiconductor device of Example 1 and is a cross-sectional view of the semiconductor device.

The semiconductor devices shown in FIGS. 19 and 20 can be used as an inlet (also referred to as an inlay) incorporated in a non-contact IC tag or the like. Note that the semiconductor device of the present invention includes not only an intermediate product such as an inlet, but also an end product such as an IC card, an ID label, and an IC tag in which an inlet as shown in FIGS. 19 and 20 is incorporated in a plastic card, attached to a sticker label, or embedded in paper.

It was examined whether a predetermined operation was performed by inputting a signal wirelessly in the semiconductor device which has been completed through a manufacturing method of this example, shown in FIGS. 19 and 20. It was confirmed that all semiconductor devices (semiconductor devices including the integrated circuit which was an observation object by the optical microscope) which were observed by the optical microscope were operated. In consideration of the result of the observation with the optical microscope in Table 1, it is thought that static electricity generated by peeling was able to be prevented from being discharged when the element formation layer was separated from the substrate while liquid was being supplied. That is, by implementing the present invention, it was found that the semiconductor element included in the semiconductor device can be prevented from being destroyed and characteristics of the semiconductor element can be prevented from being deteriorated due to electric charge generated by peeling.

Note that in the structure of this example, the lower surface of the element formation layer 102 which appears by peeling is formed of a tungsten oxide or a silicon oxynitride and is a high resistive material; however, an integrated circuit can be prevented from being destroyed due to peeling discharge, by using this example. Therefore, by using the present invention, a material which forms the lower surface of the element formation layer 102 is not limited to a conductive material and can be formed of an insulating material. As described above, with the present invention, electric charge generated by peeling can be prevented from being discharged into both inside of two separated layers; therefore, even when the lower surface of the element formation layer is formed of an insulating material, the semiconductor element included in the element formation layer can be prevented from being destroyed and characteristics of the semiconductor element can be prevented from being deteriorated, due to static electricity generated by peeling.

In addition, when the element formation layer 102 is bent, the element formation layer 102 is separated from the substrate. An external force is applied to the element formation layer 102 by bending the element formation layer 102, and as a result of this, the element formation layer 102 may be broken or cracked in some case. It is found that destruction (crack or breaking) due to transformation of the element formation layer 102 is hardly generated by supplying liquid and separating the element formation layer 102 from the substrate 100 as the present invention.

TABLE 2

Observation results of element formation layers with optical microscope.

| Kind of liquid | Number of observed substrates | Total number of observed element formation layers | Total number of element formation layers in which breaking and the like are observed | Percentages of element formation layers in which breaking and the like are occurred |
| --- | --- | --- | --- | --- |
| $CO_2$ water | 2 | 96 | 4 | 4.2% |
| Without liquid | 2 | 96 | 53 | 55.2% |

Table 2 shows results of observation on whether the element formation layer 102 has a crack or breaking in the state of FIG. 18, by using the optical microscope. Table 2 shows observations of a substrate (a sample) in which $CO_2$ water is used for the liquid 116 and a substrate (a sample) to which the liquid 116 is not supplied, by using the optical microscope. It is found that about half the number of the element formation layers which are peeled without supply of liquid generates breaking or cracks; however, the generation of breaking or a crack can be reduced to about 4% by pouring $CO_2$ water.

Therefore, when the element formation layer is separated from the substrate while liquid is being supplied, destruction or characteristic deterioration of the semiconductor element due to static electricity that is generated by peeling can be prevented, and generation of destruction (breaking or a crack) of the element formation layer due to transformation can be suppressed.

Example 2

In this example, a method for supplying the liquid 116, which is different from that described in Example 1, will be described. In this example, a method for spraying the liquid 116 in an atomized form is described and description of a common portion to that in Example 1 is omitted.

Similarly to Example 1, steps which have been described with reference to FIGS. 10 to 13 are performed. Next, in Example 1, the plastic tweezers were inserted into the peeled lower surface of the element formation layer 102, and the gap 115 was generated between the upper surface of the release layer 101 and the lower surface of the element formation layer 102, as shown in FIG. 14. In this example, this step is unnecessary.

Figure 21:
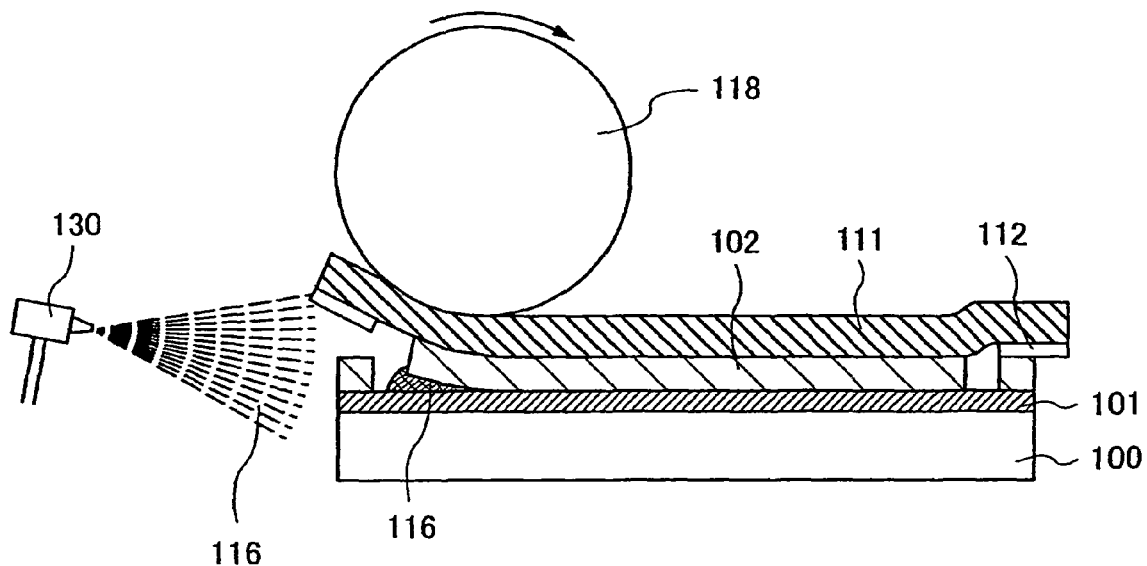
FIG. 21 is a cross-sectional view for illustrating a method for manufacturing a semiconductor device of Example 2 and is a diagram for illustrating a method for supplying the liquid 116 in the gap 115 between the element formation layer 102 and the release layer 101.

Next, the roller 118 is rolled on the heat release film 111 similarly to Example 1, and the element formation layer 102 with the heat release film 111 is peeled from the release layer 101. When the roller 118 is rolled, the liquid 116 in an atomized form was sprayed from spray means 130 into a gap between the element formation layer 102 and the release layer 101 from a side where the roller 118 starts rolling, as shown in FIG. 21. The liquid 116 is sprayed so as to wet a portion where peeling is generated by rotating the roller 118.

Figure 22:
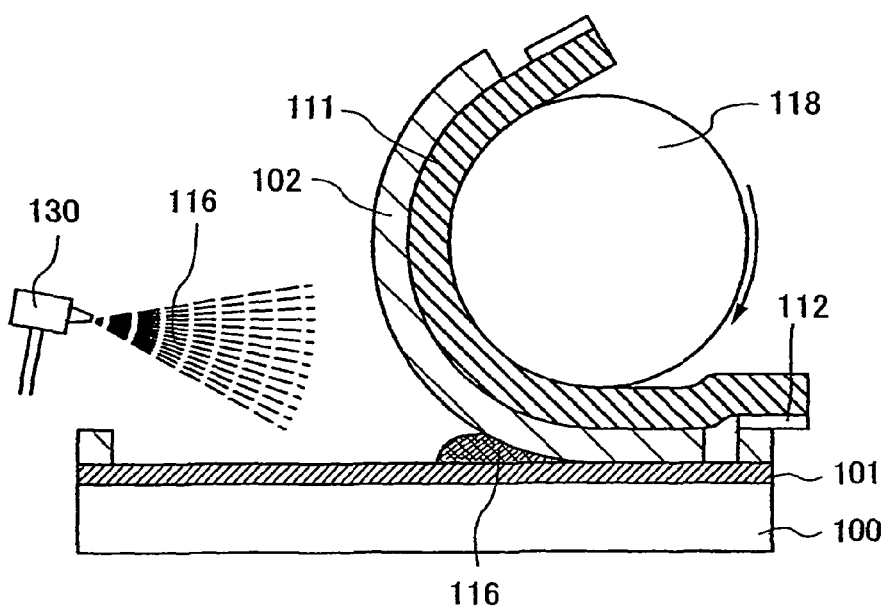
FIG. 22 is a cross-sectional view for illustrating a method for manufacturing a semiconductor device of Example 2 and is a diagram for illustrating a method for supplying the liquid 116 in the gap 115 between the element formation layer 102 and the release layer 101 while the element formation layer 102 is being peeled.

As shown in FIG. 22, while the roller 118 is being rotated, the liquid 116 is sprayed from the spray means 130 so as to wet the portion where peeling is generated. With the roller 118, the element formation layer 102 with the heat release film 111 is separated from the substrate 100. Next, a stack of the heat release film 111 and the element formation layer 102 is peeled from the roller 118 and fixed to the heat release film 111 as shown in FIG. 18, so that the element formation layer 102 which is divided into each semiconductor device is obtained.

By the method of this example, the steps up to and including the steps in FIG. 18 were performed by using $CO_2$ water which was the same concentration as that in Example 1, as the liquid 116. Except that a method for supplying liquid was different, the same steps were performed by using the same means as that in Example 1. Note that, in this example, $CO_2$ water was sprayed by a sprayer.

In this example, similarly to Example 1, it was examined whether there is power breakdown due to discharge by observing the element formation layer 102 by the optical microscope in the state of FIG. 18. The observation with the optical microscope was conducted on all integrated circuits formed by using the same substrate 100. In this example, there was no integrated circuit in which power breakdown was generated.

In the element formation layer 102 observed by the optical microscope, similarly to Example 1, it was examined whether the semiconductor device performed a predetermined operation by manufacturing the semiconductor device shown in FIG. 19 or FIG. 20 and inputting a signal wirelessly. It was confirmed that all semiconductor devices operated. Therefore, similarly to Example 1, it was confirmed that, by the method of this example, static electricity generated by peeling was able to be prevented from being discharged when the element formation layer was separated from the substrate while liquid was being supplied.

In this example, since a step of expanding the gap 115 between the upper surface of the release layer 101 and the lower surface of the element formation layer 102 shown in FIG. 14 is unnecessary, automation of a peeling step is easier than that of the method of Example 1.

Example 3

In this example, a method for supplying the liquid 116, which is different from those described in Example 1 and Example 2, will be described. Description of a common portion to that in Example 1 is omitted. In this example, a method for supplying liquid by separating the element formation layer 102 from a substrate while the substrate is being immersed in the liquid 116 is described.

Figure 23:
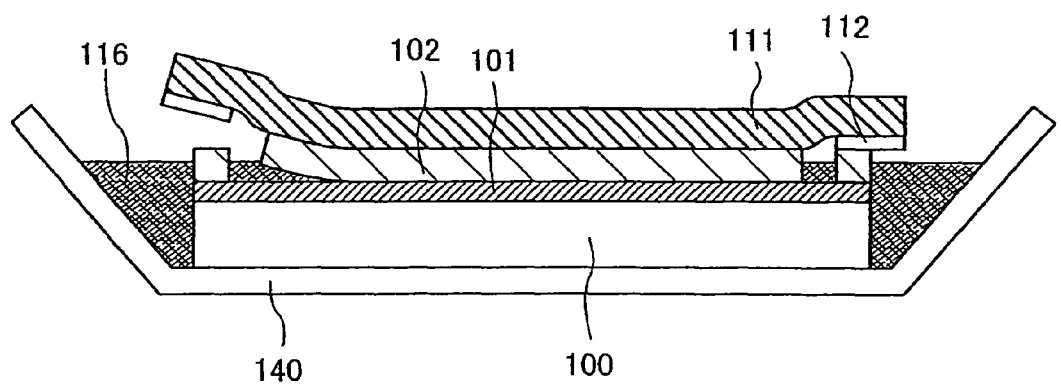
FIG. 23 is a cross-sectional view for illustrating a method for manufacturing a semiconductor device of Example 3 and is a diagram for illustrating a method for supplying the liquid 116 in a gap between the element formation layer 102 and the release layer 101.

Similarly to Example 1, steps described with reference to FIGS. 10 to 14 are performed. Next, as shown in FIG. 23, a container 140 which contains the liquid 116 is prepared. In the container 140, the substrate 100, the release layer 101, and the element formation layer 102 are immersed in the liquid 116. The substrate 100 is put in the container 140 so that the heat release film 111 comes on the top.

Figure 24:
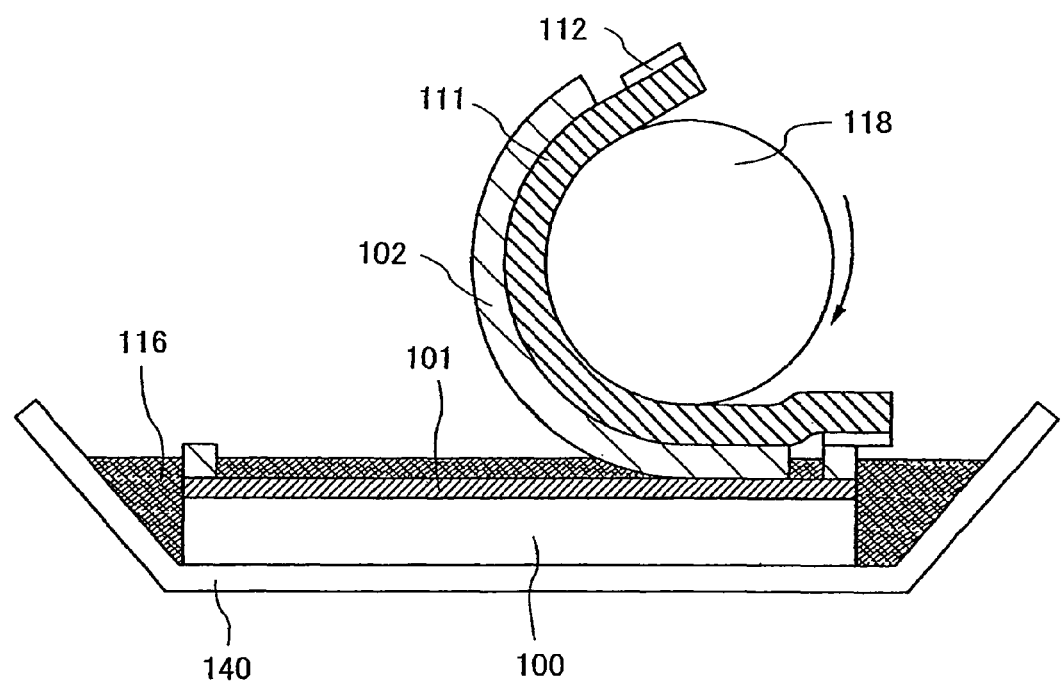
FIG. 24 is a cross-sectional view for illustrating a method for manufacturing a semiconductor device of Example 3 and is a diagram for illustrating a method for supplying the liquid 116 in a gap between the element formation layer 102 and the release layer 101 while the element formation layer 102 is being peeled.

In this state, as shown in FIG. 24, the roller 118 is rolled on the heat release film 111, and the element formation layer 102 with the heat release film 111 is peeled from the release layer 101. Since the release layer 101 is peeled from the element formation layer 102 in the liquid 116, a surface where peeling is generated can always be immersed in the liquid 116. It is preferable to adjust the amount of the liquid 116 in the container 140 so as not to immerse the heat release film 111 in the liquid 116. This is because, when the heat release film 111 touches the liquid 116, the heat release film 111 is hard to be attached to the roller 118.

Next, the stack of the heat release film 111 and the element formation layer 102 is peeled from the roller 118 and fixed to the heat release film 111 as shown in FIG. 18, so that the separated element formation layer 102 is obtained.

By the method of this example, the steps up to and including the steps in FIG. 18 were performed by using $CO_2$ water which was the same concentration as that in Example 1, as the liquid 116. Except that a method for supplying liquid was different, the same steps were performed by using the same means as that in Example 1.

In this example, similarly to Example 1, it was checked whether power breakdown due to discharge existed by observing the element formation layer 102 by the optical microscope in the state of FIG. 18. The observation with the optical microscope was conducted on all integrated circuits formed over one substrate 100. In this example, there was no integrated circuit in which power breakdown was generated, as well.

In the element formation layer 102 observed by the optical microscope, similarly to Example 1, it was examined whether the semiconductor device operated by manufacturing the semiconductor device shown in FIG. 19 or FIG. 20 and inputting a signal wirelessly. It was confirmed that all semiconductor devices operated. Therefore, similarly to Example 1, it was confirmed that, by the method of this example, static electricity generated by peeling was able to be prevented from being discharged when the element formation layer was separated from the substrate while liquid was being supplied.

Note that in this example, it is necessary to pay attention to the depth of the liquid 116 in the container 140. It was desirable that the depth of the liquid 116 be almost the same height as the thickness of the substrate 100. When the depth of the liquid 116 is deep, there is a possibility that the upper surface of the heat release film 111 is wetted and the heat release film 111 is not attached to the roller 118. On the other hand, when the depth of the liquid 116 is extremely shallow, there is a possibility that the liquid 116 does not enter a gap between the release layer 101 and the element formation layer 102. In a state of FIG. 23, when the substrate 100 was put in the container 140, it can be visually confirmed that the liquid 116 enters the gap between the release layer 101 and the element formation layer 102. By checking whether the liquid 116 enters, the amount of the liquid 116 is controlled.

As described in Examples 1 to 3, when the element formation layer is separated from the substrate while liquid is being supplied, destruction or characteristic deterioration of the semiconductor element due to static electricity that is generated by peeling can be prevented. Further, generation of destruction such as breaking or a crack generated by applying mechanical external force in the element formation layer can be reduced.

Example 4

In this example, a structural example of a semiconductor device having an integrated circuit which can communicate with an antenna wirelessly will be described with reference to FIGS. 29A to 29D.

Figure 29A:
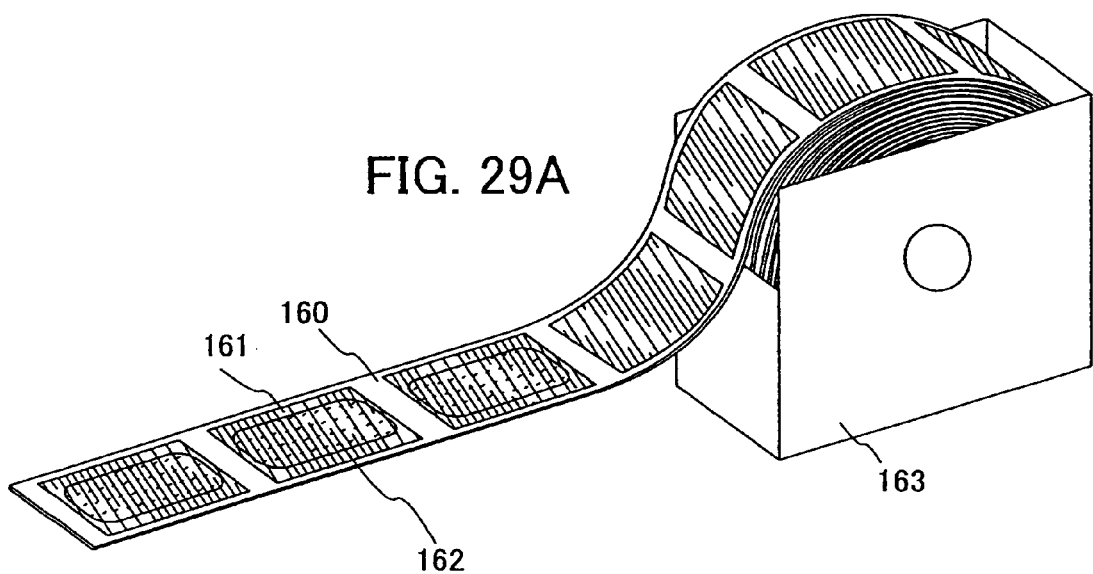
FIGS. 29A to 29D are diagrams each showing a structural example of a semiconductor device having an integrated circuit which can wirelessly communicate with an antenna.

FIG. 29A shows a structural example of an ID label as a semiconductor device of the present invention. A plurality of ID labels 161 is formed on a label board 160 (separate sheet). Each ID label 161 contains an inlet (also referred to as an inlay) 162 having an antenna which can communicate wirelessly and an integrated circuit. The ID labels 161 are put in a box 163. In addition, information on the product and service (e.g., a product name, a brand name, a trademark, an owner of the trademark, a seller, a manufacturer, or the like) are written on the ID labels 161. On the other hand, an ID number which is peculiar to the product (or a kind of the product) is stored in the integrated circuit incorporated in the inlet 162. Much information which cannot be written on a surface of the ID label 161, such as an production area, a selling area, quality, a raw material, efficacy, a use application, quantity, the shape, price, a production method, usage, a production time, a usage time, an expiration date, an instruction of the product, or information on intellectual properties of the product can be stored in the integrated circuit of the inlet 162.

Figure 29B:
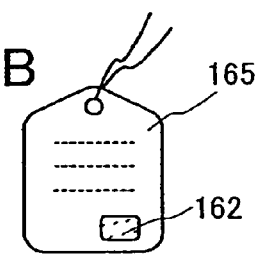

FIG. 29B shows a structural example of an ID tag 165. In the ID tag 165, the inlet 162 is incorporated in a paper tag or a plastic tag. By providing the ID tag 165 which can communicate wirelessly to a product, product management becomes easy. For example, when the product is stolen, the criminal can be quickly recognized by tracing a path of the product. By providing the ID tag in this manner, a product having excellent so-called traceability can be distributed.

Figure 29C:
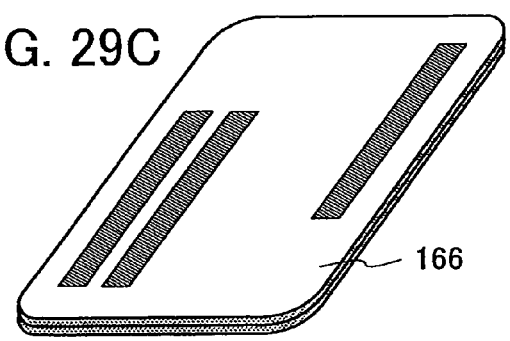

FIG. 29C shows a structural example of an ID card 166. The ID card 166 has a structure in which the inlet 162 (not shown) is interposed between two plastic cards. As such an ID card 166, any of cards such as a cash card, a credit card, a prepaid card, an electronic ticket, electronic money, a telephone card, and a membership card is given as an example.

Figure 29D:
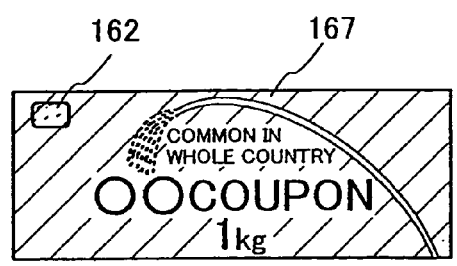

FIG. 29D shows a structural example of a semiconductor device in which paper contains an integrated circuit and an example in which the present invention is used for a bearer bond 167. The inlet 162 is embedded in the bearer bond 167. Note that although a stamp, tickets such as a ticket and a platform ticket, an admission ticket, a gift certificate, a book coupon, a stationary coupon, a beer coupon, a rice coupon, various kinds of gift coupons, various kinds of service ticket, and the like are included in the bearer bond 167, needless to say, the present invention is not limited to these.

Example 5

Figure 30A:
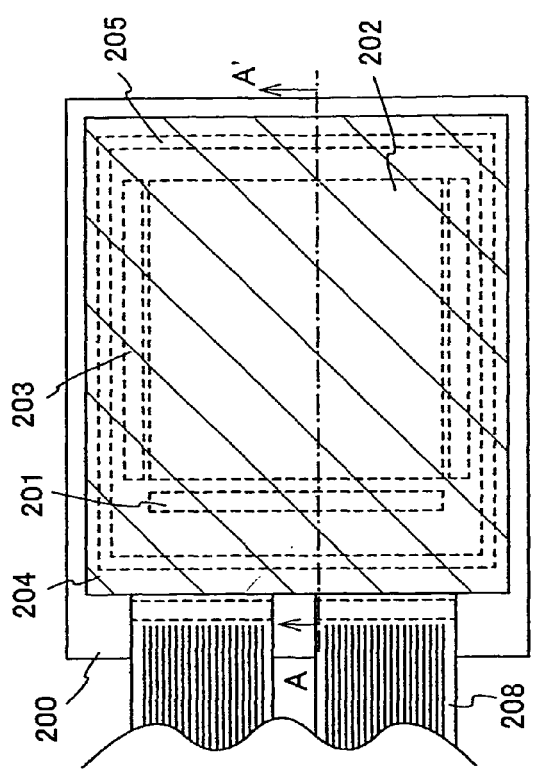
FIGS. 30A and 30B are diagrams each showing a structural example of a semiconductor device of the present invention.

In this example, a structural example of an active matrix liquid crystal module as a semiconductor device of the present invention will be described with reference to FIGS. 30A and 30B. FIG. 30A is a front elevation showing a liquid crystal module, and FIG. 30B is a cross-sectional view cutting along a line A-A' in FIG. 30A.

Reference numeral 200 denotes a first flexible substrate; 201 shown by a dotted line denotes a signal line driver circuit; 202 denotes a pixel portion; and 203 denotes a scan line driver circuit. Over the first flexible substrate 200, the pixel portion 202 formed of a thin film transistor or the like, the signal line driver circuit 201, and the scan line driver circuit 203 are formed in an element formation layer 190. By fixing the element formation layer 190 to the first flexible substrate 200 with an adhesive agent, a liquid crystal module substrate is formed. The liquid crystal module substrate is manufactured by any of the methods described in the above-described embodiment mode and Examples 1 to 4.

Figure 30B:
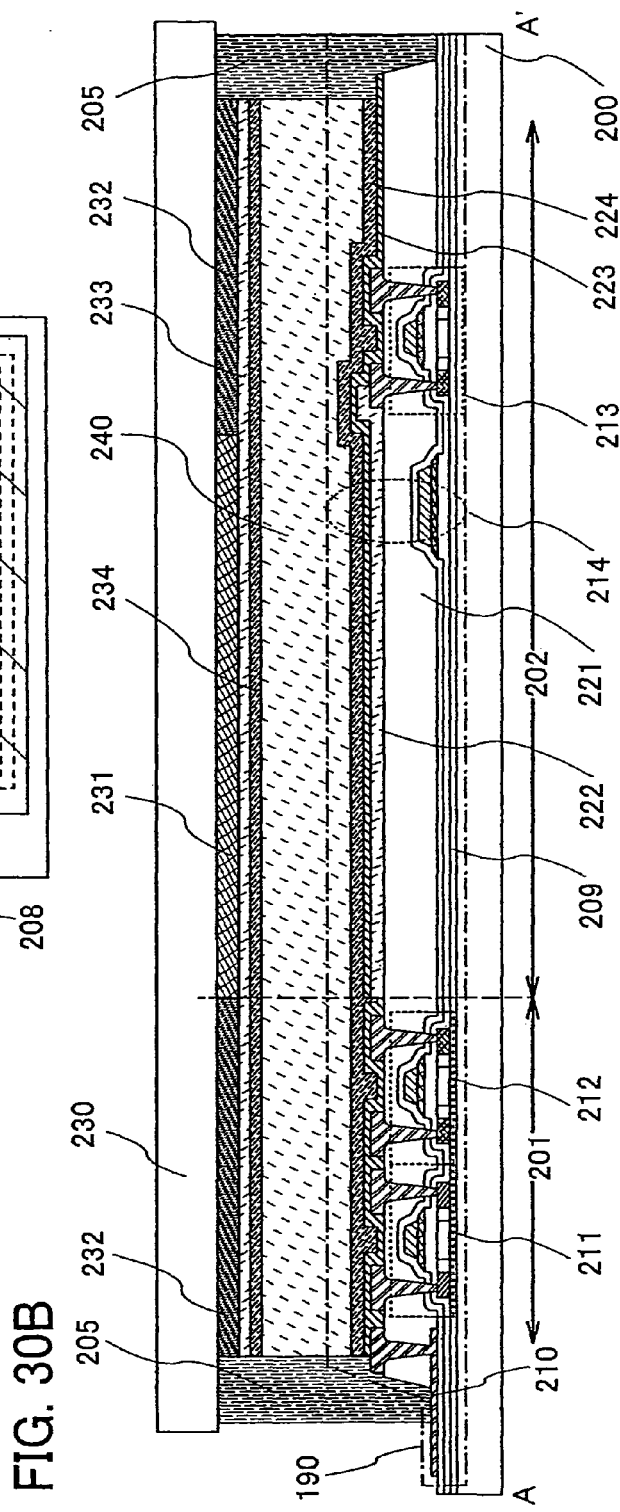

Next, the cross-sectional structure of the element formation layer 190 will be descried with reference to FIG. 30B. In the element formation layer 190, a semiconductor element is formed over a base film 209 formed of an insulating film. The signal line driver circuit 201 includes a CMOS circuit formed in a combination of an n-channel thin film transistor 211 and a p-channel thin film transistor 212. The pixel portion 202 includes a switching thin film transistor 213 and a capacitor 214. The switching thin film transistor 213 is covered with an interlayer insulating film 221. A pixel electrode 222 is formed over the interlayer insulating film 221. The pixel electrode 222 is electrically connected to the switching thin film transistor 213.

A protective film 223 is formed so as to cover a wiring of the switching thin film transistor 213, the pixel electrode 222, wirings of the n-channel thin film transistor 211 and the p-channel thin film transistor 212. By the protective film 223, an impurity can be prevented from entering an active layer of the thin film transistor, the interlayer insulating film 221, and the like. An orientation film 224 is formed over the protective film 223. Note that the orientation film 224 is formed, as necessary.

A wiring 210 in the element formation layer 190 is a wiring for transmitting a signal or the like to be inputted to the signal line driver circuit 201 and the scan line driver circuit 203, and is connected to an FPC (Flexible Printed Circuit) 208 to serve as an external input terminal. Note that the liquid crystal module of the present invention includes both of a mode in which only the FPC 208 is provided and a mode in which both the FPC 208 and a PWB (Printed Wiring Board) are provided.

The liquid crystal module of this example includes the liquid crystal module substrate having the first flexible substrate 200 and the element formation layer 190, the counter substrate in which a second flexible substrate 230 is a base material, a sealant 205, liquid crystal 240, and the FPC (Flexible Printed Circuit) 208. The liquid crystal module of this example can be bent.

The counter substrate is provided with a color filter 231, a black matrix (BM) 232, an opposite electrode 233, and an orientation film 234 which are formed on the second flexible substrate 230. The color filter 231 can be provided on a first flexible substrate 200 side. In addition, a liquid crystal module of an IPS system can be formed by providing the opposite electrode 233 in the element formation layer 190 of the first flexible substrate 200.

Facing the first flexible substrate 200, the second flexible substrate 230 is fixed to the first flexible substrate 200 with the sealant 205, and the liquid crystal 240 is injected between the first flexible substrate 200 and the second flexible substrate 230 and sealed with the sealant 205.

In this example, the example in which the signal line driver circuit 201 and the scan line driver circuit 203 are formed in the element formation layer 190 is shown; however, only the pixel portion 202 is formed in the element formation layer 190, the signal line driver circuit 201 and the scan line driver circuit 203 which are formed of an IC chip using a silicon wafer can be electrically connected to the pixel portion 202 over the first flexible substrate 200 by a COG method or a TAB method.

Example 6

Figure 31A:
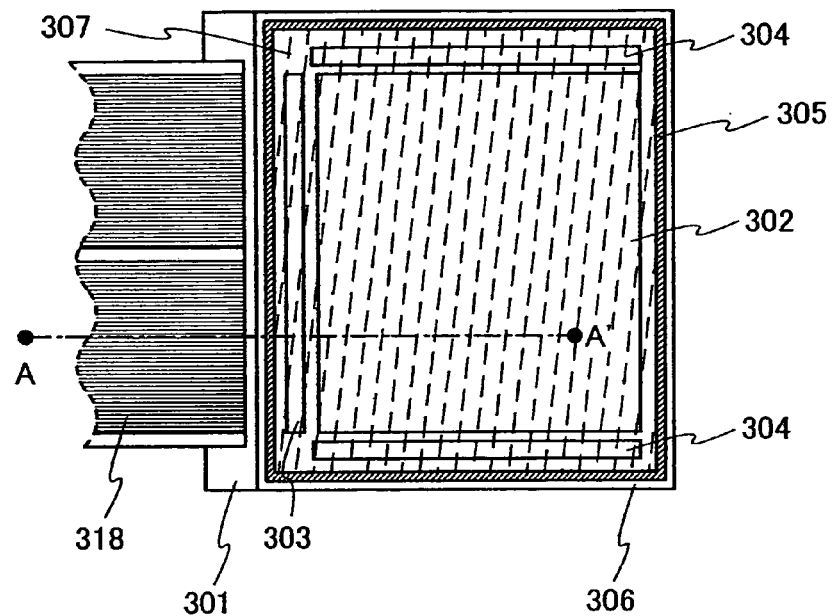
FIGS. 31A and 31B are diagrams each showing a structural example of a semiconductor device of the present invention.

In this example, a structural example of an active matrix EL module will be described as a semiconductor device of the present invention, with reference to FIGS. 31A and 31B. FIG. 31A is a front elevation of the EL module, and FIG. 31B is a cross-sectional view cutting along a line A-A' of FIG. 31A.

Figure 31B:
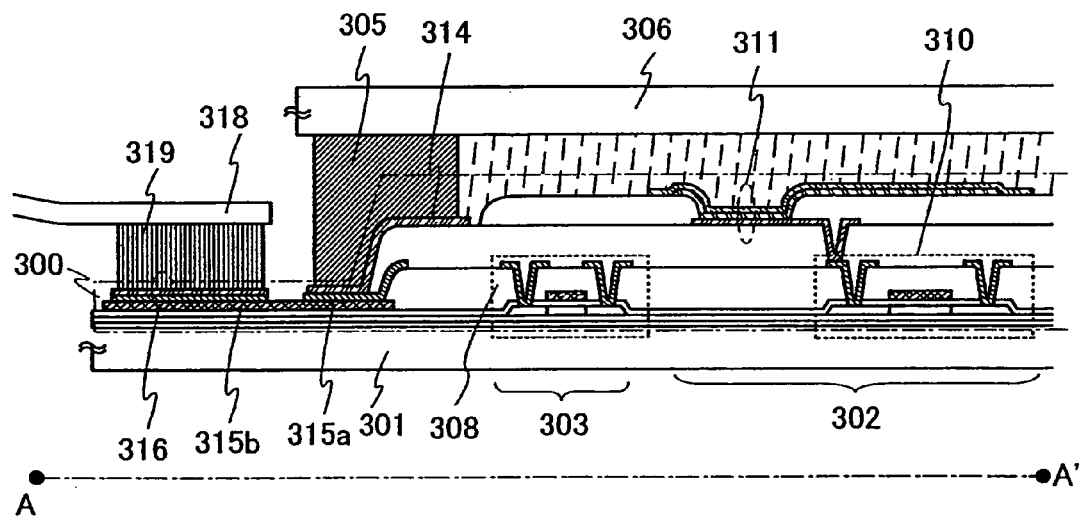

The EL module shown in FIGS. 31A and 31B can be bent, and has a structure in which a transistor and a light-emitting element which are formed in an element formation layer are sealed with a sealant 305 formed between a first flexible substrate 301 and a second flexible substrate 306.

Over the first flexible substrate 301, an element formation layer 300 including a pixel portion 302, a signal line driver circuit 303, and a scan line driver circuit 304 is fixed with an adhesive agent, and a substrate for an EL module is formed. The substrate for the EL module is formed by any of the methods described in embodiment mode and Examples 1 to 4.

The EL module is formed by sealing the substrate for the EL module and the second flexible substrate 306 with the sealant 305. In the EL module of this example, a space sealed with the substrate for the EL module, the sealant 305, and the second flexible substrate 306 is filled with a filler 307. As the filler 307, an ultraviolet curable resin, a thermosetting resin, polyvinyl chloride, acrylic, polyimide, an epoxy resin, a silicone resin, polyvinyl butyral, or ethylene vinylene acetate can be used, in addition to inert gas such as nitrogen or argon.

A structure of the element formation layer 300 is described below. The pixel portion 302, the signal line driver circuit 303, and the scan line driver circuit 304 each include a plurality of thin film transistors. In FIG. 31B, only a thin film transistor 308 included in the signal line driver circuit 303 and a thin film transistor 310 included in the pixel portion 302 are shown. The pixel portion 302 includes a light-emitting element 311, and the light-emitting element 311 is electrically connected to the thin film transistor 310.

A lead wiring 314 is a wiring for supplying a signal or power supply to a circuit in the element formation layer 300 from outside. The lead wiring 314 is connected to a connection terminal 316 of a two-layer structure through a lead wiring 315a and a lead wiring 315b. The connection terminal 316 is electrically connected to a terminal included in a flexible printed circuit (FPC) 318 through an anisotropic conductive film 319.

Example 7

A semiconductor device of the present invention includes electronic devices provided with the liquid crystal module described in Example 5 or the EL module described in Example 6 in a display portion. Hereinafter, a liquid crystal module and an EL module are collectively referred to as a display module. As such an electronic device, there are a monitor for a computer, a television set (also simply referred to as a television or a television receiver), a camera such as a digital camera a digital video camera, a mobile phone set (also simply referred to as a mobile phone or a cellular phone), a portable information terminal such as a PDA (Personal Digital Assistant), a notebook computer, a car audio system, a navigation system, a digital music player, a portable DVD reproducing device, a portable game machine, an arcade game machine, and the like. The specific examples will be described with reference to FIGS. 32A to 32C.

Figure 32A:
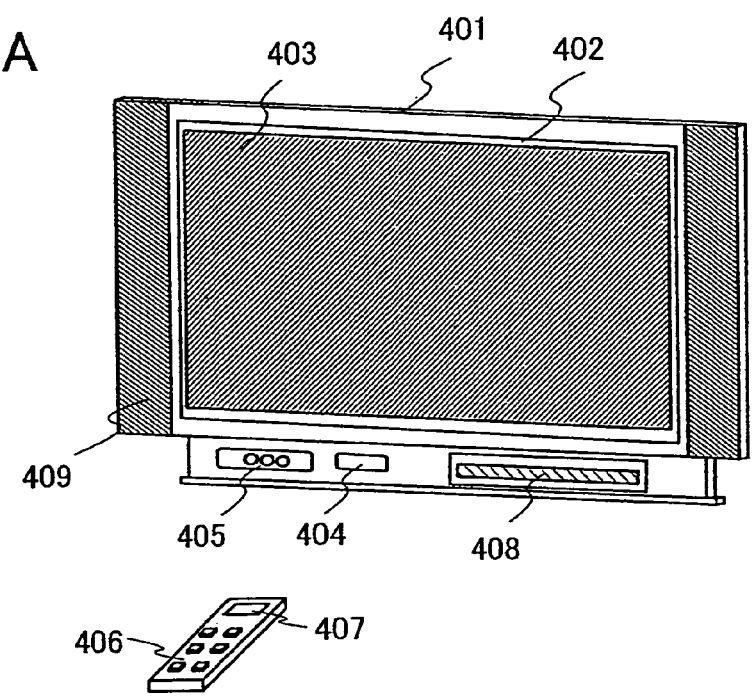
FIGS. 32A to 32C are diagrams each showing a structural example of a semiconductor device of the present invention.
Figure 32B:
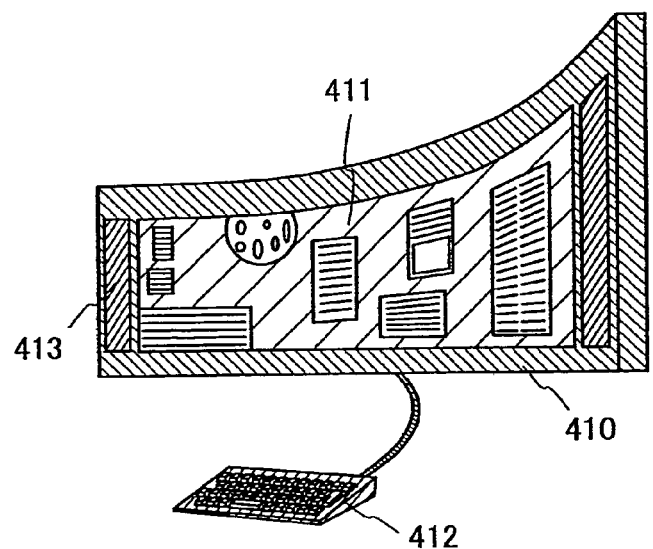

FIGS. 32A and 32B show television devices. As a structure of an incorporated display module, there are the following structures: a structure in which only a pixel portion is formed in an element formation layer, and a scan line driver circuit and a signal line driver circuit are mounted on a substrate; a structure in which a pixel portion and a scan line driver circuit are formed in an element formation layer and a signal line driver circuit as a driver IC is mounted on a substrate; a structure in which a pixel portion, a signal line driver circuit, and a scan line driver circuit are formed in an element formation layer; and the like. The display module of the present invention can have any of the structures. Note that a scan line driver circuit and a signal line driver circuit may be mounted on a substrate by a mounting method such as a TAB method or a COG method.

In the television device, as an external circuit other than a display module, a video signal amplifier circuit which amplifies a video signal among signals received by a tuner, a video signal processing circuit which converts the signals outputted from the video signal amplifier circuit into chrominance signals corresponding to respective colors of red, green, and blue, a control circuit which converts the video signal into an input specification of the driver IC, and the like are provided on an input side of the video signal. The control circuit outputs signals to both a scan line side and a signal line side. In the case of digital drive, a signal dividing circuit can be provided on the signal line side and an input digital signal may be divided into a plurality of numbers and supplied.

An audio signal among signals received by the tuner is sent to an audio signal amplifier circuit and an output of the audio signal amplifier circuit is supplied to a speaker through an audio signal processing circuit. A control circuit receives control information of a receiving station (reception frequency) or sound volume from an input portion and transmits signals to the tuner and the audio signal processing circuit.

As shown in FIGS. 32A and 32B, in the television device, a display module is incorporated into a chassis. A main screen 403 is formed by using the display module, and a speaker portion 409, an operation switch, and the like are provided as its accessory equipment. Thus, a television device can be completed.

As shown in FIG. 32A, a liquid crystal module 402 is incorporated in a chassis 401. General TV broadcast can be received by a receiver 405. When the display device is connected to a communication network by wired or wireless connections via a modem 404, one-way (from a sender to a receiver) or two-way (between a sender and a receiver or between receivers) information communication can be performed. The television device can be operated by using a switch built in the chassis 401 or a remote controller 406. A display portion 407 for displaying output information can also be provided in the remote controller.

Further, the television device may include a sub screen 408 formed using a second display panel so as to display channels, volume, or the like, in addition to the main screen 403. In this structure, the main screen 403 may be formed using an EL module having a wide viewing angle, and the sub screen 408 may be formed using a liquid crystal module capable of displaying images with less power consumption. In order to reduce the power consumption preferentially, the main screen 403 may be formed using a liquid crystal module, and the sub screen 408 may be formed using an EL module, which can be switched on and off.

FIG. 32B shows a television device having a large-sized display portion, for example, a 20- to 80-inch display portion. The television device includes a chassis 410, a keyboard portion 412 that is an operation portion, a display portion 411, a speaker portion 413, and the like. A display module is used for the display portion 411. Since a bendable display module is used for the display portion 411 in FIG. 32B, the television device in which the display portion 411 is curved is formed. By using a flexible display module in this manner, a shape of the display portion 411 is not limited to only a plane, and television devices of various shapes can be manufactured.

Since a yield of the display module can be improved by the present invention, cost reduction can be achieved. Therefore, a television device using the present invention can be manufactured at low cost even when a large screen display portion is included.

Naturally, the display module of the present invention is not limited to the television device, and can be applied to various use applications as a large-sized display medium such as an information display board at a train station, an airport, or the like, or an advertisement display board on the street, as well as a monitor of a personal computer.

Figure 32C:
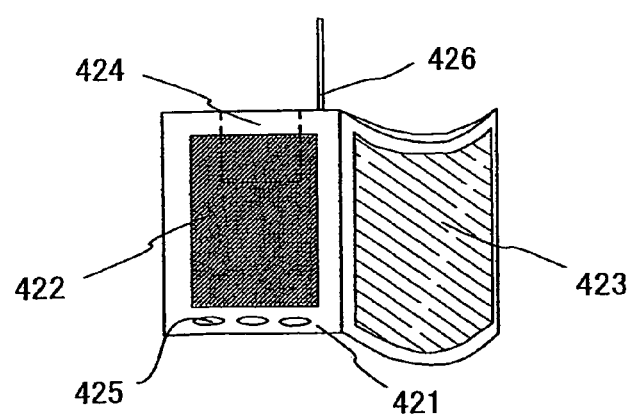

A display module of the present invention can be applied to display portions of various portable devices, such as a cellular phone or a digital camera. FIG. 32C shows a structural example of an e-book reader as an example of a portable device. The e-book reader includes a main body 421, display portions 422 and 423, a storage medium 424, an operation switch 425, an antenna 426, and the like. When a flexible display module is used for the display portion 422, a portable device can be reduced in weight.

Example 8

This example will explain that force to generate peeling can be weakened and generation of damage such as breaking or a crack in the element formation layer can be avoided by separating an element formation layer from a substrate while liquid is being supplied.

First, a method for manufacturing a sample with which a peel test was performed is described.

Figure 33:
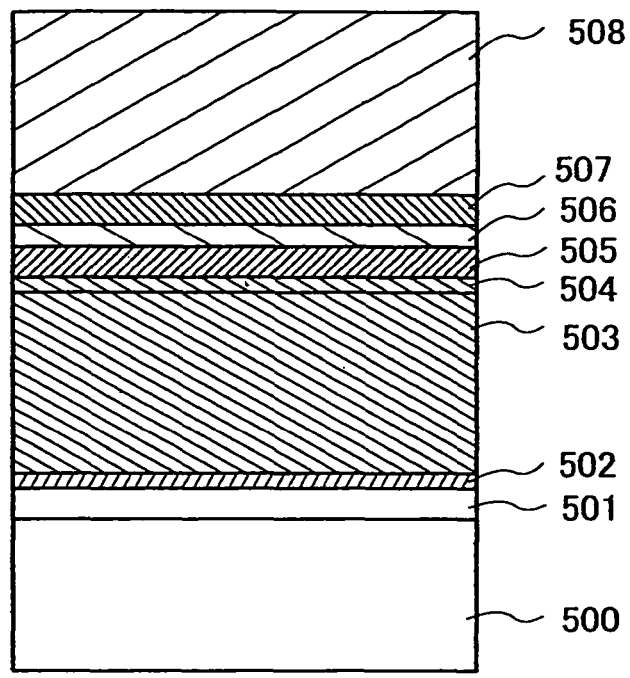
FIG. 33 is a cross-sectional view showing a stacked structure of a sample with which a peel test is performed.

FIG. 33 is a diagram for illustrating a stacked structure of the sample with which the peel test was performed. A glass substrate 500 was prepared. As the glass substrate 500, non-alkaline glass (product name: AN100) made by Asahi Glass Co., Ltd. was used. The thickness is 0.7 mm and the size is 100 mm×120 mm.

Over the glass substrate 500, a silicon oxynitride ($SiO_xN_y$, x>y) film 501 was formed having a thickness of 100 nm with a plasma CVD apparatus. As process gas for forming the silicon oxynitride film 501, $SiH_4$ and $N_2O$ were used. Over the silicon oxynitride film 501, a tungsten film 502 having a thickness of 50 nm was formed with a sputtering apparatus. Tungsten was used as a target, and argon gas was used as gas for discharge. The tungsten film 502 functions as a release layer.

Over the tungsten film 502, a stacked-layer film which is regarded as an element formation layer and formed of an insulating film and a semiconductor film is formed. First, a silicon oxynitride ($SiO_xN_y$, x>y) film 503 was formed having a thickness of 600 nm with a plasma CVD apparatus. As process gas to form the silicon oxynitride film 503, $SiH_4$ and $N_2O$ were used. In addition, before depositing the silicon oxynitride film 503 over the tungsten film 502, only $N_2O$ gas was supplied to a chamber in which the silicon oxynitride film 503 was formed, and $N_2O$ gas was excited to a plasma state; accordingly, the surface of the tungsten film 502 was oxidized, whereby a tungsten oxide was formed. This plasma treatment is treatment for generating peeling at an interface between the tungsten film 502 and the silicon oxynitride film 503, which is preferential to the other interface.

By using $SiH_4$, $H_2$, $NH_3$ and $N_2O$ for process gas, a silicon oxynitride ($SiO_xN_y$, x<y) film 504 having a thickness of 100 nm was formed over the silicon oxynitride film 503 with a plasma CVD apparatus. By using $SiH_4$ and $N_2O$ for process gas, a silicon oxynitride ($SiO_xN_y$, x>y) film 505 having a thickness of 100 nm was formed over the silicon oxynitride film 504 with the plasma CVD apparatus. By using $SiH_4$ and $H_2$ for process gas, an amorphous silicon film 506 having a thickness of 66 nm was formed over the silicon oxynitride film 505 with the plasma CVD apparatus. The silicon oxynitride film 504, the silicon oxynitride film 505, and the amorphous silicon film 506 were formed in the same chamber of the plasma CVD apparatus, and process gas to be supplied in the chamber was changed, whereby these films were formed in succession.

Next, by using $SiH_4$, $H_2$, $N_2$, $NH_3$ and $N_2O$ for process gas, a silicon oxynitride ($SiO_xN_y$, x<y) film 507 having a thickness of 100 nm was formed over the amorphous silicon film 506 with the plasma CVD apparatus. By using $SiH_4$ and $N_2O$ for process gas, a silicon oxynitride ($SiO_xN_y$, x>y) film 508 having a thickness of 600 nm was formed over the silicon oxynitride film 507 with the plasma CVD apparatus.

Figure 34:
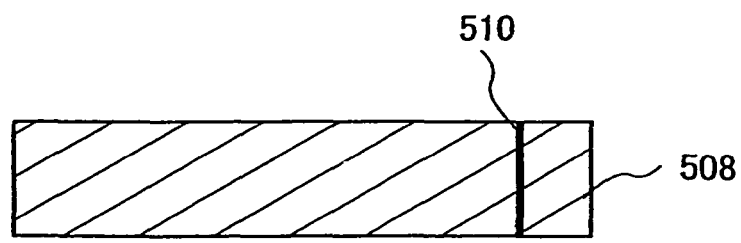
FIG. 34 is a plan view of a sample with which a peel test is performed.

Next, by irradiation of a UV laser beam from the glass substrate 500 and cutting the glass substrate 500 over which the films 501 to 508 were formed, the size of a sample was set as a rectangle of 20 mm×100 mm. FIG. 34 is a plan view of the sample processed into a rectangular shape. Next, in order to form a trigger for peeling, a groove 510 which reached the tungsten film 502 was formed in the sample by UV laser beam irradiation, as shown in FIG. 34. By forming the groove 510, peeling is generated between the silicon oxynitride film 503 and the tungsten film 502. The sample for a peel test was prepared by the above-described method.

Next, a method of a peel test is described. Heat peeling tape having a width of about 20 mm was prepared. As the heat peeling tape, elegrip tape (item: FA1250) made by Denki Kagaku Kogyo Kabushiki Kaisha was used. The total thickness of a base material of this heat peeling tape and an adhesive layer is 150 μm, and a thickness of the adhesion layer is 50 μm. The base material of the heat peeling tape is formed of PET (polyethylene terephthalate).

The heat peeling tape was attached to the sample in which the groove had been formed. The heat peeling tape is attached to a silicon oxynitride film 508 side. By peeling the heat peeling tape, the stacked-layer film formed of the films 508 to 503 can be peeled from the substrate 500.

Tension which was required for peeling the stacked-layer film formed of the films 508 to 503 from the tungsten film 502 was measured by pulling the heat peeling tape. For a peel test, a compact table-top universal tester (EZ-TEST EZ-S-50N) made by Shimadzu Corporation was used. As a peel test method, the adhesive tape/adhesive sheet test method based on standard number of JIS Z0237 of Japanese Industrial Standards (JIS) was used. Tension was measured in the case where peeling was performed while pure water was being supplied to the sample and in the case where peeling was performed without supply of pure water. Note that supply of pure water was performed by dropping pure water on a peeling portion with a dropper after the sample was attached to the tester.

Figure 35:
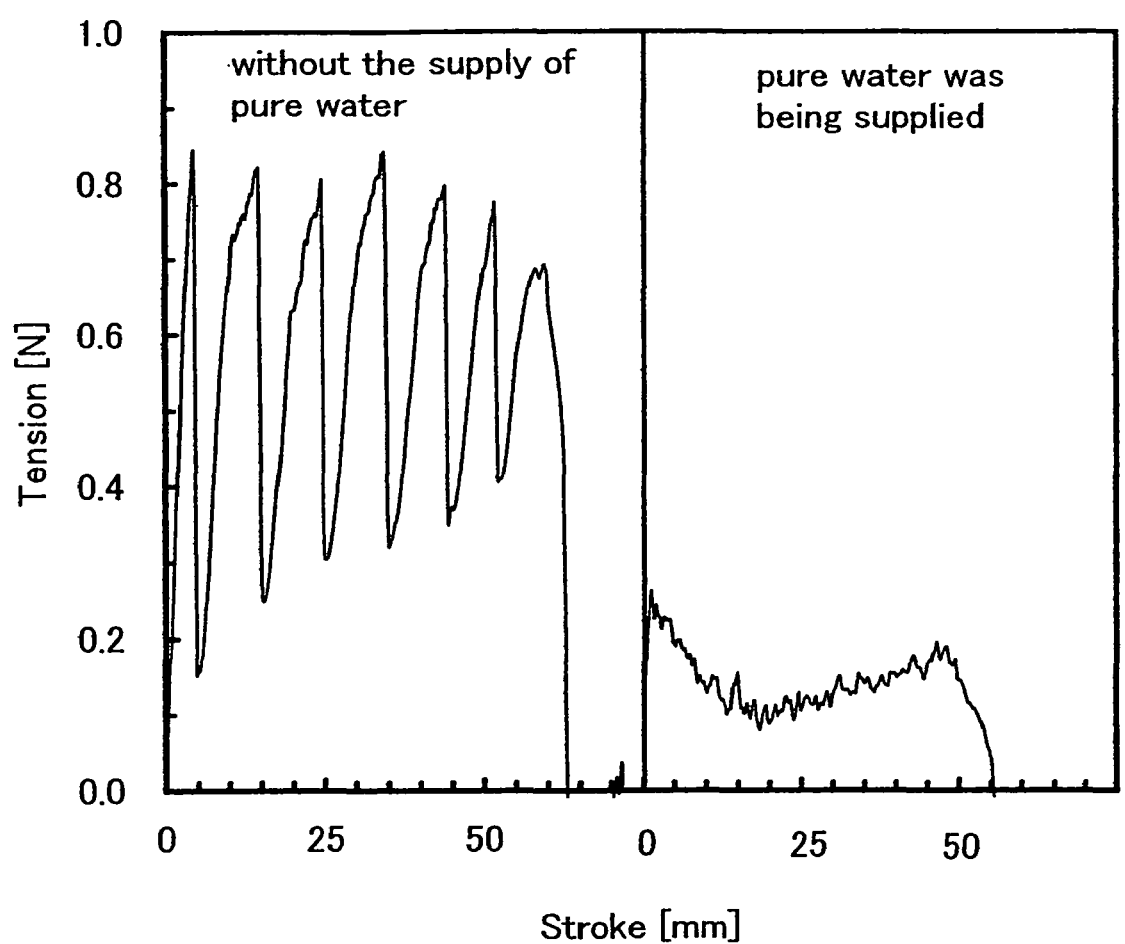
FIG. 35 is a graph showing a result of a peel test.

FIG. 35 is a graph showing a peel test result. A vertical axis of FIG. 35 indicates tension applied to the heat peeling tape, and a horizontal axis thereof indicates a stroke. The stroke shows displacement of the point of application of force, that is, displacement of the point where peeling is generated.

According to the graph of FIG. 35, it is found that tension in the case where pure water is supplied is ½ or less than that in the case where pure water is not supplied. According to this peel test, it was confirmed that peeling was able to be performed with weaker force, by supplying pure water.

In addition, when a peel test was performed without supply of pure water, the graph of FIG. 35 shows a sawtooth profile. The sawtooth profile shows that peeling proceeds as follows. When peeling is performed without supply of pure water, force which is stronger than that in the case where pure water is supplied so that peeling proceeds is applied at the point of application. However, when peeling proceeds, the force is suddenly reduced. Peeling proceeds while the increase of force applied to such a point of application and sudden decrease are repeated.

When the sample which was peeled without the supply of pure water was observed, it was confirmed that a crack was generated at a portion where tension was suddenly reduced. On the other hand, a crack was not generated in the sample with which the peel test was performed while pure water was being supplied. As described above, it was found that generation of a crack can be prevented by performing peeling while pure water was being supplied.

Note that, although pure water is polar liquid, the peel test was performed while nonpolar liquid having a nonpolar medium was being supplied for comparison. For example, as liquid, hydrofluoroether (HFE) was used. In the case where the peel test was performed while HFE was being supplied, tension which was larger than that in the case where liquid was not supplied was required in order to perform peeling. In the case of using benzene, a similar result to that of the case of using HFE was obtained.

The following was found from the above peel test. When peeling is performed by supplying polar liquid such as pure water, an aqueous solution, ethanol, or acetone, discharge by peeling electrification can be eliminated; in addition, force required for peeling can be reduced and generation of damage such as a crack in an object to be peeled can be prevented.

This application is based on Japanese Patent Application serial No. 2006-266543 filed in Japan Patent Office on Sep. 29, 2006, the entire contents of which are hereby incorporated by reference.

What is claimed is:

1. A method for manufacturing a semiconductor device, comprising:
    forming a release layer over a substrate;
    forming an element formation layer including a semiconductor element over the release layer;
    providing a support base material over the element formation layer;
    forming a groove in the element formation layer with a laser beam in order to generate peeling at an interface between the release layer and the element formation layer;
    wetting a surface which is exposed by the generation of peeling with liquid; and
    further peeling the element formation layer from the substrate by winding the element formation layer and the support base material around a roller wherein the liquid spreads to wet a surface which is exposed as the peeling of the element formation layer proceeds,
    wherein discharge due to peeling electrification in the step of further peeling is preventable by wetting the surface with the liquid.

2. The method for manufacturing a semiconductor device according to claim 1, wherein the liquid is pure water.

3. The method for manufacturing the semiconductor device according to claim 1, wherein the surface of the element formation layer exposed by the generation of peeling is wetted with the liquid by using a nozzle.

4. The method for manufacturing a semiconductor device according to claim 1, wherein the release layer comprises metal.

5. The method for manufacturing a semiconductor device according to claim 1, wherein the support base material is a flexible film.

6. The method for manufacturing a semiconductor device according to claim 1, wherein the liquid is polar liquid.

7. The method for manufacturing a semiconductor device according to claim 1, wherein the liquid spreads due to a capillary phenomenon.

8. The method for manufacturing a semiconductor device according to claim 1, wherein the semiconductor element is a thin film transistor.

9. A method for manufacturing a semiconductor device, comprising:
forming a release layer over a substrate;
forming an element formation layer including a semiconductor element over the release layer;
providing a support base material over the element formation layer;
forming a groove in the element formation layer with a laser beam in order to generate peeling at an interface between the release layer and the substrate;
wetting a surface which is exposed by the generation of peeling with liquid; and
further peeling the element formation layer from the substrate by winding the element formation layer and the support base material around a roller wherein the liquid spreads to wet a surface which is exposed as the peeling of the element formation layer proceeds,
wherein discharge due to peeling electrification in the step of further peeling is preventable by wetting the surface with the liquid.

10. The method for manufacturing a semiconductor device according to claim 9, wherein the liquid is pure water.

11. The method for manufacturing a semiconductor device according to claim 9, wherein the surface which is exposed by the generation of peeling is wetted with the liquid by using a nozzle.

12. The method for manufacturing a semiconductor device according to claim 9, wherein the release layer comprises metal.

13. The method for manufacturing a semiconductor device according to claim 9, wherein the support base material is a flexible film.

14. The method for manufacturing a semiconductor device according to claim 9, wherein the liquid is polar liquid.

15. The method for manufacturing a semiconductor device according to claim 9, wherein the liquid spreads due to a capillary phenomenon.

16. The method for manufacturing a semiconductor device according to claim 9, wherein the semiconductor element is a thin film transistor.

17. A method for manufacturing a semiconductor device, comprising:
forming a release layer over a substrate;
forming an element formation layer including a semiconductor element over the release layer;
providing a support base material over the element formation layer;
forming a groove in the element formation layer with a laser beam in order to generate peeling inside the release layer;
wetting a surface which is exposed by the generation of peeling with liquid; and
further peeling the element formation layer from the substrate by winding the element formation layer and the support base material around a roller wherein the liquid spreads to wet a surface which is exposed as the peeling of the element formation layer proceeds,
wherein discharge due to peeling electrification in the step of further peeling is preventable by wetting the surface with the liquid.

18. The method for manufacturing a semiconductor device according to claim 17, wherein the liquid is pure water.

19. The method for manufacturing a semiconductor device according to claim 17, wherein the surface which is exposed by the generation of peeling is wetted with the liquid by using a nozzle.

20. The method for manufacturing a semiconductor device according to claim 17, wherein the release layer comprises metal.

21. The method for manufacturing a semiconductor device according to claim 17, wherein the support base material is a flexible film.

22. The method for manufacturing a semiconductor device according to claim 17, wherein the liquid is polar liquid.

23. The method for manufacturing a semiconductor device according to claim 17, wherein the liquid spreads due to a capillary phenomenon.

24. The method for manufacturing a semiconductor device according to claim 17, wherein the semiconductor element is a thin film transistor.

25. A method for manufacturing a semiconductor device, comprising:
forming a release layer over a substrate;
forming an element formation layer including a semiconductor element over the release layer;
forming a groove in the element formation layer with a laser beam;
providing a support base material over the element formation layer; and
peeling the element formation layer from the substrate by applying mechanical force,
wherein a surface which is exposed by the peeling is wetted with liquid during the peeling step,
wherein the liquid spreads due to a capillary phenomenon, and
wherein discharge due to peeling electrification in the step of peeling is preventable by wetting the surface with the liquid.

26. The method for manufacturing a semiconductor device according to claim 25, wherein the liquid is pure water.

27. The method for manufacturing a semiconductor device according to claim 25, wherein the surface which is exposed by the peeling is wetted with the liquid by using a nozzle.

28. The method for manufacturing a semiconductor device according to claim 25, wherein the release layer comprises metal.

29. The method for manufacturing a semiconductor device according to claim 25, wherein the support base material is a flexible film.

30. The method for manufacturing a semiconductor device according to claim 25, wherein the liquid is polar liquid.

31. The method for manufacturing a semiconductor device according to claim 25, wherein the semiconductor element is a thin film transistor.

* * * * *